(12) United States Patent
Roberts et al.

(10) Patent No.: US 10,312,869 B2
(45) Date of Patent: Jun. 4, 2019

(54) METHODS AND DEVICES RELATING TO HIGH GAIN AMPLIFIERS

(71) Applicant: THE ROYAL INSTITUTION FOR THE ADVANCEMENT OF LEARNING/MCGILL UNIVERSITY, Montreal (CA)

(72) Inventors: Gordon Roberts, Montreal (CA); Ming Yang, Montreal (CA)

(73) Assignee: THE ROYAL INSTITUTION FOR THE ADVANCEMENT OF LEARNING / MCGILL UNIVERSITY, Montreal (CA)

( * ) Notice: Subject to any disclaimer, the term of this patent is extended or adjusted under 35 U.S.C. 154(b) by 0 days.

(21) Appl. No.: 15/630,582

(22) Filed: Jun. 22, 2017

(65) Prior Publication Data
US 2017/0373650 A1 Dec. 28, 2017

Related U.S. Application Data

(60) Provisional application No. 62/354,178, filed on Jun. 24, 2016.

(51) Int. Cl.
| | |
|---|---|
| H03F 3/04 | (2006.01) |
| H03F 1/02 | (2006.01) |
| H03F 1/08 | (2006.01) |
| H03F 3/45 | (2006.01) |
| H03H 11/04 | (2006.01) |

(52) U.S. Cl.
CPC ............ *H03F 3/04* (2013.01); *H03F 1/0205* (2013.01); *H03F 1/083* (2013.01); *H03F 3/45183* (2013.01); *H03F 3/45475* (2013.01); *H03F 2200/117* (2013.01); *H03F 2200/153* (2013.01); *H03F 2203/45138* (2013.01); *H03H 11/0422* (2013.01)

(58) Field of Classification Search
CPC . H03F 1/0205; H03F 3/04; H03F 1/34; H03F 3/45; H03F 3/45071; H03F 3/45183
USPC ........................................................ 330/260
See application file for complete search history.

(56) References Cited

U.S. PATENT DOCUMENTS

| | | | | |
|---|---|---|---|---|
| 7,075,364 | B2 * | 7/2006 | Gudem | H03H 11/1234 |
| | | | | 327/552 |
| 7,636,003 | B2 * | 12/2009 | Liu | H03F 3/08 |
| | | | | 327/307 |
| 9,319,003 | B2 * | 4/2016 | Chen | H03F 1/34 |
| 2013/0194040 | A1 * | 8/2013 | Lin | H03F 1/34 |
| | | | | 330/257 |

OTHER PUBLICATIONS

B. K. Thandri, J.Silva-Martinez, "A robust feedforward compensation scheme for multistage operational transconductance amplifiers with no Miller capacitors", IEEE Journal of Solid-State Circuits, vol. 38, No. 2, Feb. 2003.

* cited by examiner

*Primary Examiner* — Khanh V Nguyen
(74) *Attorney, Agent, or Firm* — Norton Rose Fulbright Canada LLP

(57) ABSTRACT

There is described herein methods and devices for high DC gain closed loop operation amplifiers exploiting cascaded low gain stages and a controller-based compensation circuit for stability.

20 Claims, 22 Drawing Sheets

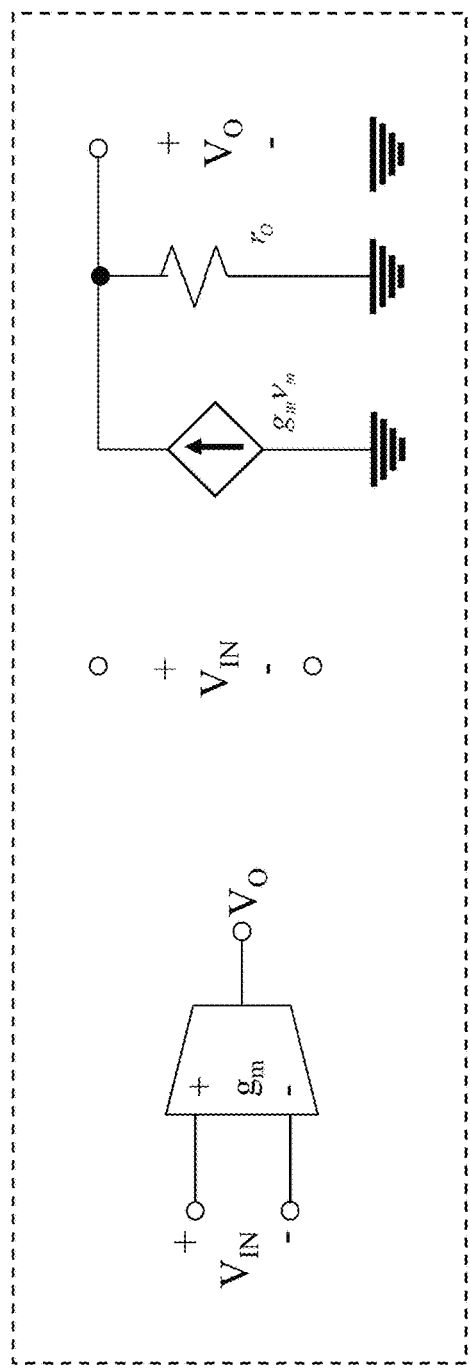
Figure 5A
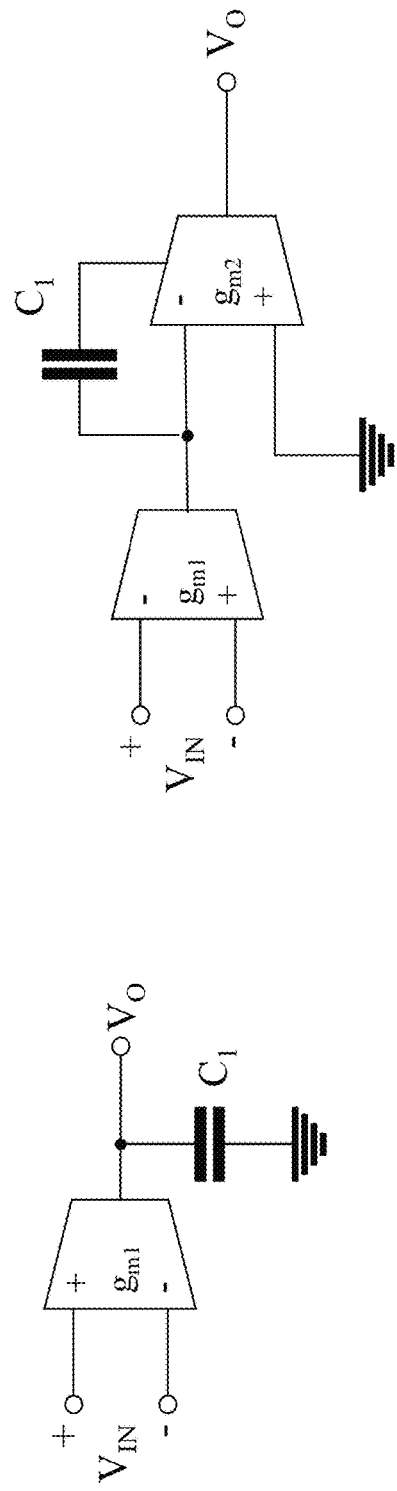
Figure 5C
Figure 5B

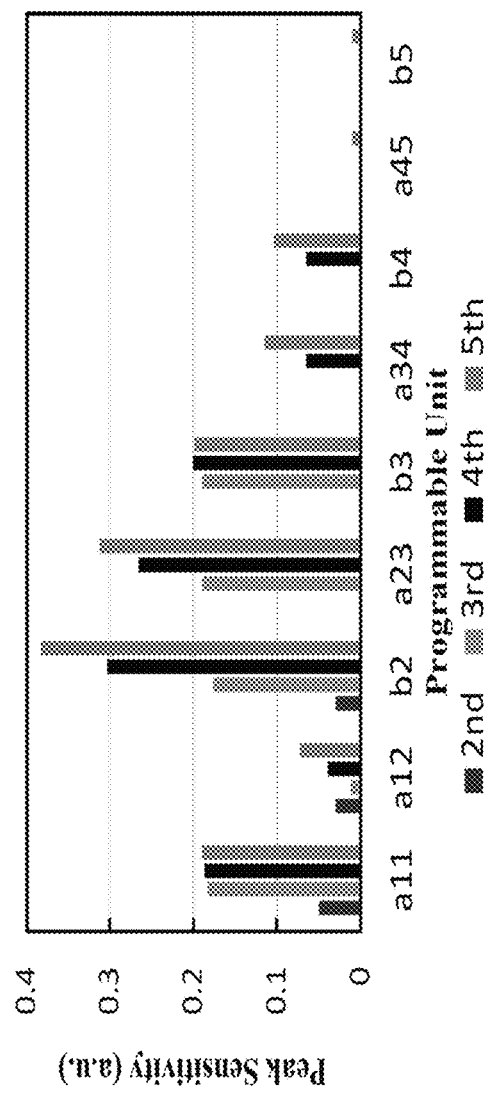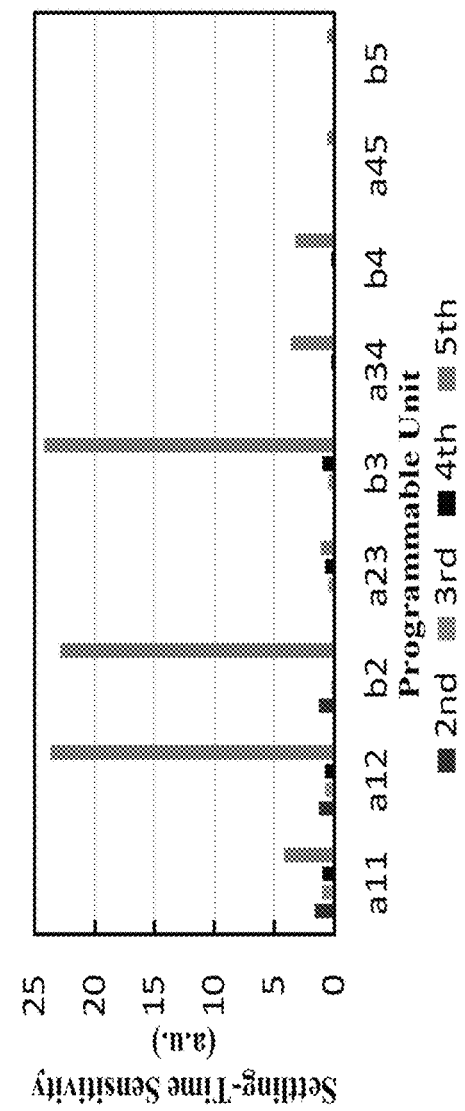
Figure 9A
Figure 9B

METHODS AND DEVICES RELATING TO HIGH GAIN AMPLIFIERS

CROSS-REFERENCE TO RELATED APPLICATIONS

This application claims the benefit of U.S. Provisional Patent Application No. 62/354,178 filed on Jun. 24, 2016, the contents of which are hereby incorporated by reference.

TECHNICAL FIELD

This disclosure relates to methods and devices for high gain closed loop amplifiers which are compatible with a broad range of integrated and discrete semiconductor circuit technologies.

BACKGROUND OF THE ART

Operational transconductance amplifiers (OTAs) are key building blocks for many types of signal processing algorithms realized in CMOS IC technologies. Unfortunately, as transistor dimensions scale downwards with advancing technology developments, so too does their intrinsic voltage gain, which in turn, reduces the upper limit of the open-loop gain achievable by any OTA. Low-gain OTAs have an immediate impact on the absolute accuracy that the system can achieve. If we consider that any time domain specification is a combination of overshoot, settling time, and steady-state error, an ideal system constructed with infinite-gain OTAs can satisfy all three metrics simultaneously, however a system constructed with low-gain OTAs cannot. For the most part, low-overshoot and fast settling time specifications can be met, but the final steady-state error cannot be met. In essence, the system would fail its absolute accuracy requirements.

As OTAs realized in advanced CMOS nodes have very low DC gain, high performance systems constructed with these components will fail to meet their performance expectations. Accordingly, it would be beneficial to provide circuit designers with a methodology for designing and manufacturing ultra-high gain amplifiers.

SUMMARY

There is described herein methods and devices for high DC gain closed loop operation amplifiers exploiting cascaded low gain stages and a controller-based compensation circuit for stability.

In accordance with a first broad aspect, there is provided an amplifier circuit comprising a plurality of cascaded circuit elements arranged in a closed-loop topology, the closed-loop topology comprising a plurality of gain stages defined by the cascaded circuit elements, and a controller provided in the closed-loop topology, the plurality of cascaded circuit elements and the controller together implementing an open-loop transfer function composed of an amplifier function and a remainder function, the gain stages corresponding to the amplifier function and the controller configured to implement the remainder function.

In accordance with another broad aspect, there is provided method for providing an amplifier circuit. The method comprises selecting a closed-loop transfer function for the amplifier circuit, the closed-loop transfer function having a corresponding open-loop transfer function composed of an amplifier function and a remainder function, determining a closed-loop topology for a plurality of cascaded circuit elements and a controller, the cascaded circuit elements defining a plurality of gain stages that correspond to the amplifier function of the open-loop transfer function, and configuring the controller to implement the remainder function of the open-loop transfer function.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 5A-5C are examples of basic single-ended Gm-C integrators;

FIGS. 9A-9B illustrate example sensitivity analyses of an OTA in a unity-gain closed-loop configuration;

DETAILED DESCRIPTION

Figure 1:
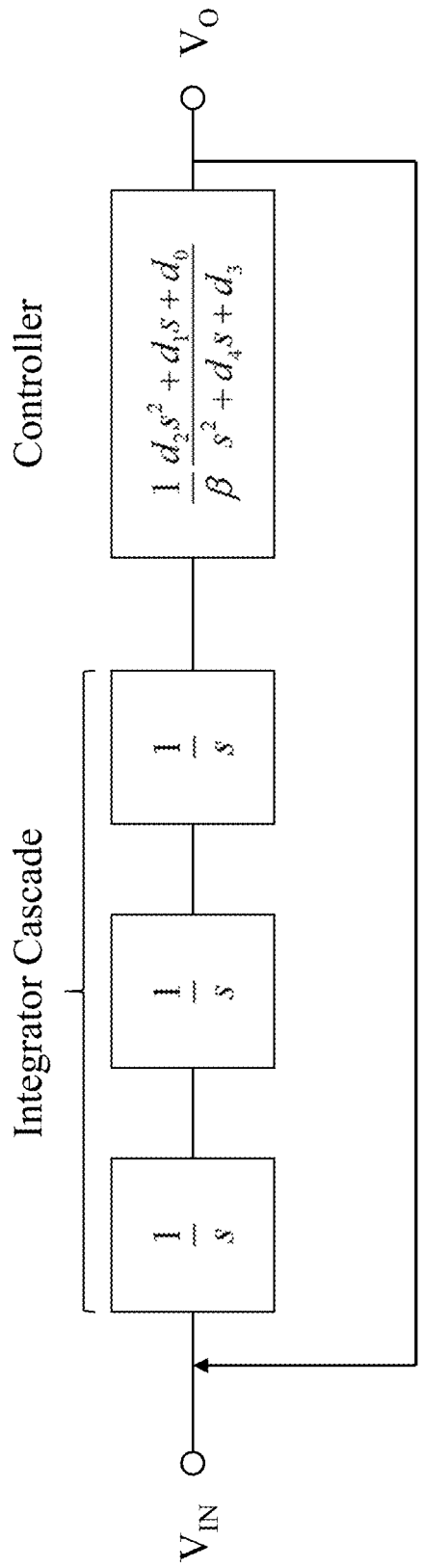
FIG. 1 is a block diagram of an example $5^{th}$ order ultra-high gain OTA.

The present disclosure is directed to amplifiers and more particularly to methods and devices for high DC gain closed loop operation amplifiers exploiting cascaded low gain stages which are compatible with a broad range of integrated and discrete semiconductor circuit technologies. Although the examples herein focus on operational transconductance amplifiers (OTA), the methods and devices are applicable other types of amplifiers, such as operational amplifiers and the like.

It is proposed herein to combine a reduction in the system response, i.e. a longer settling time, with the introduction of a high level of overshoot. Cascading of multiple single-stage amplifiers is much less sensitive to reductions in voltage supply levels and more suitable to small-dimensional CMOS technologies than, for example, cascoding may be. However, cascading multiple stages together to achieve large DC gains leads to stability issues when inserted into negative-feedback loop configurations. In order to counter this issue, a controller is provided to stabilize operation of the circuit in a closed-loop configuration.

A methodology for providing an amplifier circuit begins by selecting a desired closed-loop transfer function. A controller-based compensation circuit is then synthesized and placed in cascade or integrated alongside the numerous gain stages represented by, for example, undamped integrators. The gain stages may also be implemented using other simple low-gain circuit elements, such as differentiators, bandpass resonators, dampers, inverters and the like.

The closed loop transfer function has a corresponding open loop transfer function generally represented by Equations (0-A) and (0-B), where Equation (0-B) is the relationship between the open loop transfer function of the amplifier, the transfer function of the cascaded gain stages, and the transfer function of the controller when the cascaded gain stages and the controller are inserted into a closed-loop topology. Note that beta is an arbitrary factor.

Closed Loop $TF$=Open Loop $TF$/(1+beta*Open Loop $TF$) (0-A)

Open Loop $TF$=Cascaded Gain Stages $TF$*Controller $TF$ (0-B)

Once the closed-loop transfer function is selected, a closed loop topology is determined for a plurality of cascaded circuit elements and a controller. The cascaded circuit elements implement the cascaded gain stages transfer function. The controller may then be configured to implement the controller transfer function, also referred to as a remainder function, as will be explained in more detail below.

In this manner the design methodology allows very high gain and bandwidth amplifier structures to be constructed that have specific closed-loop behavior. The amplifier open-loop response is not limited to a single-pole response and a phase margin metric, but rather one that provides the desired closed-loop response. Accordingly, the design approach involves a cascade of circuit elements in a complex feed-forward/feedback arrangement which can be automated by a computer-aided design method. Whilst any number of circuit elements can be placed in cascade, sensitivities to process variations will typically limit this number.

The method for providing an amplifier circuit will be described in more detail using an OTA as an example. The method begins with a desired closed-loop transfer function, T(s). Assuming an OTA is embedded in a single-loop feedback structure with feedback $\beta$, the OTA open-loop transfer function can be expressed by Equation (1) The OTA closed-loop transfer function takes on the overall form given by Equation (2), where $d_i$ is the i-th coefficient of both the numerator and denominator polynomials. The general form of Equation (2) is referred to as a pole-zero canonical type transfer function owing to its transfer function depending only on the coefficients of its pole polynomial. In equation (3), A(s) is represented as a product of K integrator functions $(1/s^K)$ multiplied by the remainder function, R(s). Comparing Equation (1) with Equation (3), and substituting Equation (2) and rearranging, leads to the remainder function R(s) being defined by Equation (4).

$$A(s) = \frac{T(s)}{1 - \beta \cdot T(s)} \quad (1)$$

$$T(s) = \frac{1}{\beta} \cdot \frac{d_{K-1}s^{K-1} + \ldots + d_1 s^1 + d_0}{s^N + d_{N-1}s^{N-1} + \ldots + d_K s^K + d_{K-1}s^{K-1} + \ldots + d_1 s^1 + d_0} \quad (2)$$

$$A(s) = \frac{1}{s^K} R(s) \quad (3)$$

$$R(s) = \frac{s^K T(s)}{1 - \beta \cdot T(s)} \quad (4)$$

$$= \frac{1}{\beta} \cdot \frac{d_{K-1}s^{K-1} + \ldots + d_1 s^1 + d_0}{s^{N-K} + d_{N-1}s^{N-1-K} + \ldots + d_{K+1}s^1 + d_K}$$

For realization purposes, $N \geq 2K-1$, where K is the number of gain stages of the amplifier and N is the order of the amplifier, otherwise the order of the denominator will be less than that of the numerator, which would lead to an impractical result. This sets an upper limit on the number of integrators that can be used to form the OTA. For reasons to be given shortly, an OTA with the largest DC gain is one realized with a maximum number of integrators. For instance, an OTA described by a 5th-order transfer function could be realized using 3 integrators and a 2nd-order biquadratic function in cascade, as depicted by the block diagram shown in FIG. 1. More generally, FIG. 1 illustrates an example embodiment for a plurality of cascaded circuit elements arranged in a closed-loop topology for implementing an amplifier function, and a controller provided in the closed-loop topology that implements the remainder function.

The circuit that realizes the remainder function is what control theorists refer to as a controller. The controller is used to stabilize the closed-loop configuration. Herein, we shall refer to this method of OTA stabilization as a controller-based compensation method. It should be noted that any filter synthesis method, such as cascade of bilinear/biquads, follow-the-leader feedback filter methods, etc., can be used to synthesize the open loop transfer function of the OTA provided it can handle an input-output transfer function with multiple poles at DC. In the past, one would not expect to synthesize a transfer function with poles at DC.

Another means in which to realize the OTA open-loop transfer function A(s) is through a state-space formulation involving the parameters {A,b,c,d} expressed in general terms as Equations (5A) and (5B) where X is an N-dimensional vector describing the states of the system, u and y are the scalar input and output signals respectively, and A, b, $c^T$ and d are (N×N), (N×1), (1×N), and (1×1) constant coefficient matrices respectively. The overall transfer function can be described in terms of the state-space parameters by Equation (6) where I is the identity matrix. The advantages of a state-space formulation over the previous cascade approach is that it can directly lead to a realization with a greater number of integrators in cascade, specifically N−1 integrators, and an implicit controller function distributed among the various integrators. Following the observable canonical state-space form, the OTA transfer function described by Equations (3) and (4), can be written as Equations (7A) and (7B) respectively.

$$sX(s) = AX(s) + bu(s) \quad (5A)$$

$$y(s) = c^T X(s) + du(s) \quad (5B)$$

$$A(s) = c^T(sI - A)^{-1}b + d \quad (6)$$

$$s\begin{bmatrix} X_1(s) \\ X_2(s) \\ \cdots \\ X_{N-1}(s) \\ X_N(s) \end{bmatrix} = \begin{bmatrix} -d_{N-1} & 1 & 0 & 0 & 0 \\ 0 & 0 & 1 & 0 & 0 \\ \cdots & \cdots & \cdots & \cdots & \cdots \\ 0 & 0 & 0 & 0 & 1 \\ 0 & 0 & 0 & 0 & 0 \end{bmatrix} \begin{bmatrix} X_1(s) \\ X_2(s) \\ \cdots \\ X_{N-1}(s) \\ X_N(s) \end{bmatrix} + \begin{bmatrix} 0 \\ d_{N-2} \\ \cdots \\ d_1 \\ d_0 \end{bmatrix} u(s) \quad (7A)$$

$$y(s) = [1 \ 0 \ \cdots \ 0 \ 0] \begin{bmatrix} X_1(s) \\ X_2(s) \\ \cdots \\ X_{N-1}(s) \\ X_N(s) \end{bmatrix} \quad (7B)$$

Figure 2:
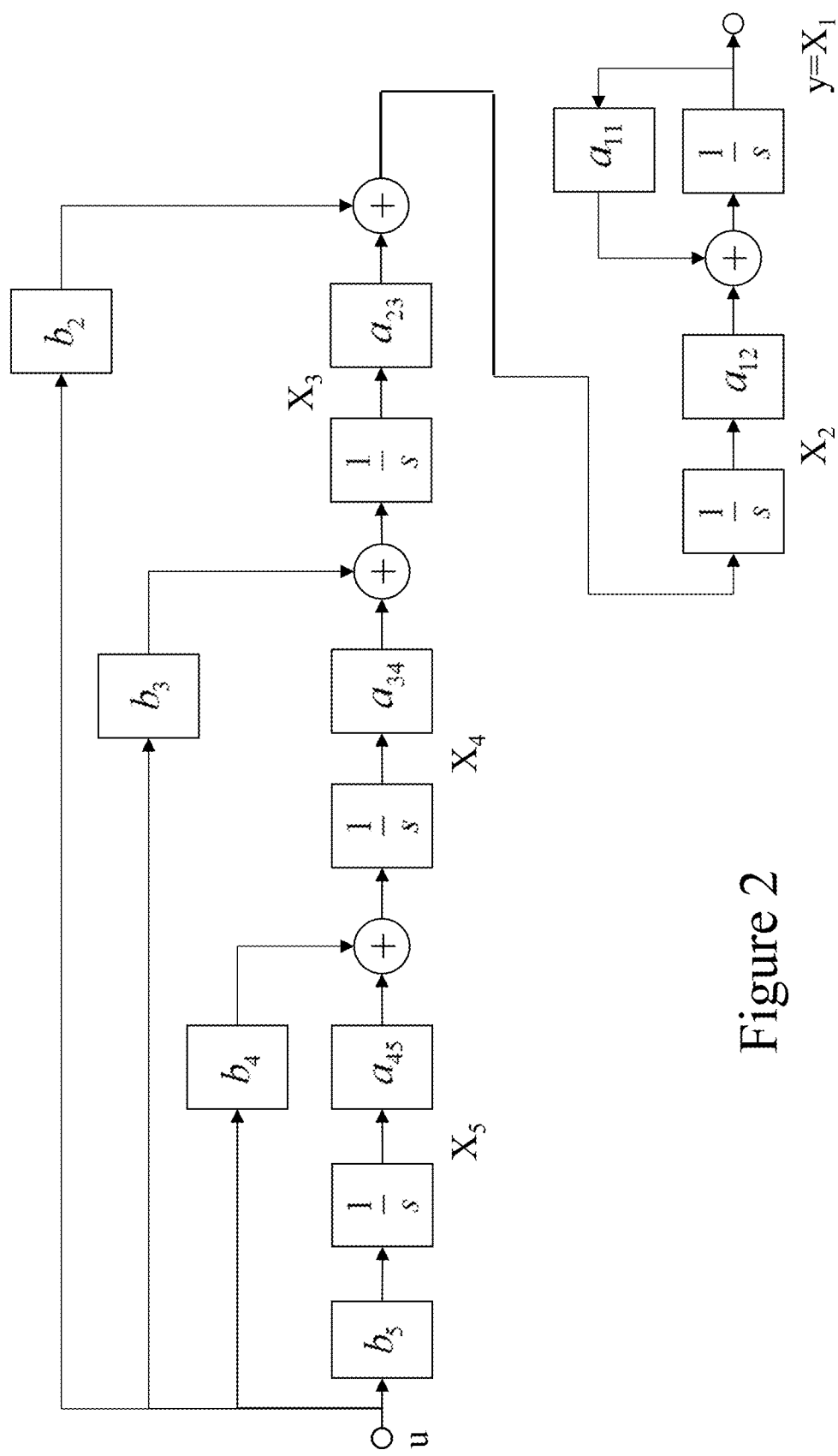
FIG. 2 is a block diagram of an example $5^{th}$ order ultra-high gain OTA realized using observable canonical state-space formulation.

Now referring to FIG. 2 there is illustrated the form of these equations for a $5^{th}$-order OTA, highlighting the cascade of four undamped integrators with several input feed forward paths. Note that the integrator closest to the output has a feedback path rather than a feed forward path involving coefficient $a_{11}$. This makes this integrator a damped integrator. As will be seen below, this stage does not provide much DC gain and instead serves the purpose of positioning the closed-loop poles. The other $b_1$ terms are responsible for positioning the three zeros of the closed-loop transfer function.

To illustrate the procedure more clearly, consider the requirement for an OTA to be used in a unity-gain closed-loop configuration having a unit step response with a $5^{th}$-order Gaussian response given by Equation (8).

$$T(s) = \frac{27.613}{s^5 + 8.082s^4 + 29.038s^3 + 57.082s^2 + 60.656s + 27.613} \quad (8)$$

Next, to enable a realization as a cascade of four undamped integrators, the numerator of T(s) is modified to include a portion of the denominator polynomial in the numerator as described earlier, resulting in Equation (9).

$$T(s) = \frac{29.038s^3 + 57.082s^2 + 60.656s + 27.613}{s^5 + 8.082s^4 + 29.038s^3 + 57.082s^2 + 60.656s + 27.613} \quad (9)$$

Figure 3:
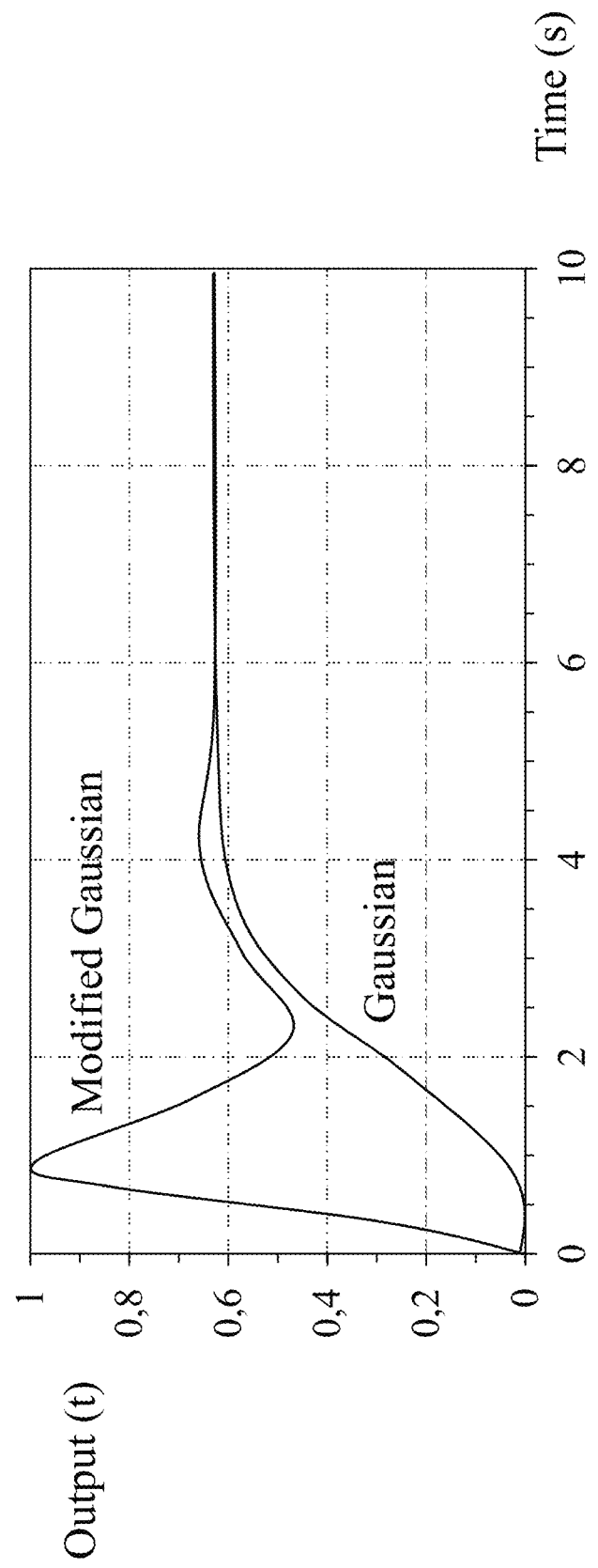
FIG. 3 is a graph comparing the step response the a $5^{th}$ order Gaussian transfer function and its modified form.

The additional left-half plane (LHP) zeros generally alter the desired step response by introducing overshoot and ringing. This is clearly visible in the plot of the step response for each transfer function as shown in FIG. 3, It should he noted at this juncture that this design principle is not based on any pole-zero cancellation technique but rather on the careful placement of the poles and zeros such that a desired closed-loop step response whose transfer function has the general form is obtained.

Assuming the step response achieves the desired closed-loop performance levels under realistic gain conditions, the resulting state-space realization would appear as that depicted in FIG. 2 with $5^{th}$ order polynomial coefficients given in the fourth row of Table 1. Also listed in Table 1 are the Gaussian polynomial coefficients for transfer function orders from 2 to 4. While the embodiments described and depicted herein use the Gaussian family of polynomials to illustrate the principles of this technique, other functions may be employed. For example, Bessel filter polynomials may also provide a starting point for a design approach. Maximally-flat delay functions, wherein are a set of transfer functions with slightly larger overshoot but faster settling time, can also serve as the starting point.

TABLE 1

Denominator Polynomial Coefficients of a Gaussian Transfer Function

| Order | $d_0$ | $d_1$ | $d_2$ | $d_3$ | $d_4$ |
|---|---|---|---|---|---|
| 2 | 1.939 | 2.573 | | | |
| 3 | 4.215 | 6.953 | 4.268 | | |
| 4 | 10.245 | 19.964 | 15.715 | 6.100 | |
| 5 | 27.613 | 60.656 | 57.082 | 29.038 | 8.082 |

Figure 4:
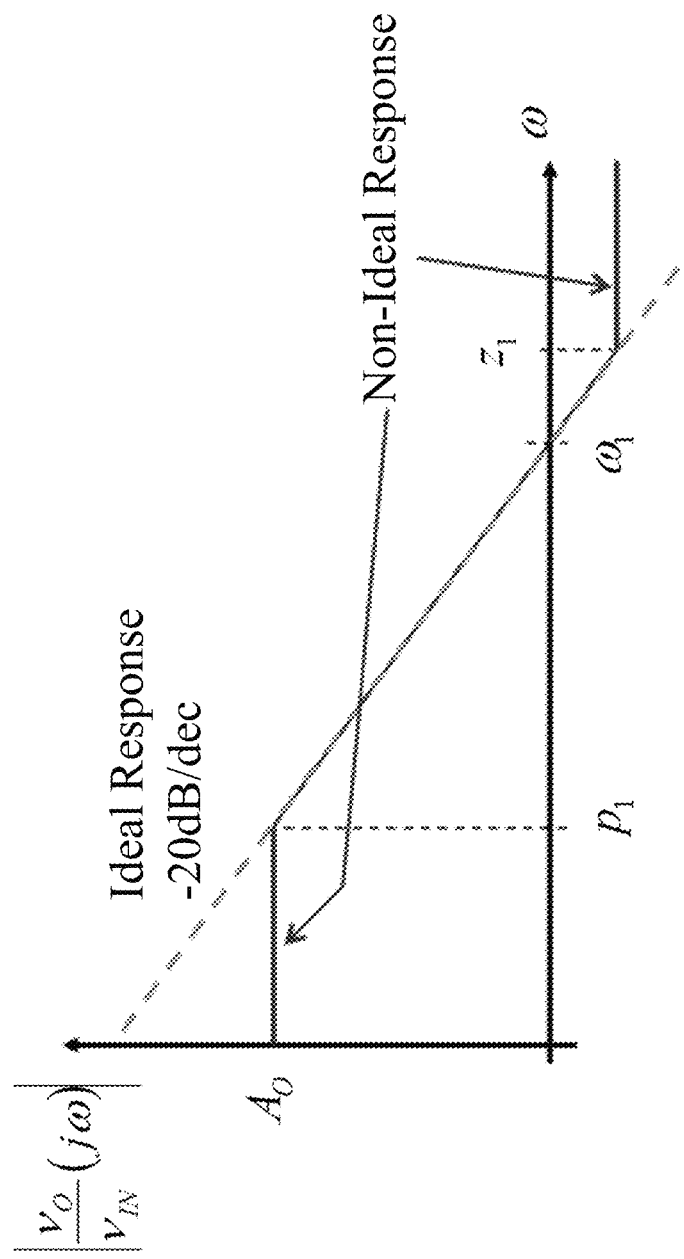
FIG. 4 is a graph showing a magnitude response of an ideal vs. non-ideal integrator operation.

The magnitude response of an undamped integrator is shown in FIG. 4 as a dashed line. Here the gain is infinite at DC and rolls off with a rate of −20 dB/decade. The gain reaches unity at the unity-gain frequency $\omega_1$. In practice, the frequency response behavior of an integrator will include the addition of a low-frequency pole, denoted as $p_1$, and, possibly, the addition of a high-frequency zero, denoted as $z_1$. The parasitic pole/zero is a result of the finite output resistance of the transistors used to construct the integrator. This effect also reduces the DC gain of the integrator from infinity to something much smaller, which is denoted as $A_0$. These effects are depicted in the solid curve of FIG. 4.

In comparison, any practical integrator will behave exactly like an undamped integrator for frequencies bounded between the low-frequency pole, $p_1$, and the high-frequency zero, $z_1$. In some embodiments, what is used is an integrator with the lowest parasitic pole and the highest parasitic zero. There are two general types of integrators typically implemented in a CMOS technology, the shunt-C and the Miller-C. These are depicted in FIGS. 5A-5C where FIG. 5A shows the trapezoidal symbol that represents a $V_{CCS}$ with transconductance $g_m$ and output resistance $r_O$. In the case of the shunt-C integrator, shown in FIG. 5B, the input-output transfer function can be described in terms of the transistor small-signal parameters $g_{m,1}$ and $r_{O,1}$ as given by Equation (10).

$$\frac{v_O}{v_{IN}}(s) = \frac{g_{m,1} r_{O,1}}{\left(1 + s \Big/ \frac{1}{r_{O,1} C_1}\right)} = \frac{A_O}{(1 + s/p_1)} \quad (10)$$

$$\frac{v_O}{v_{IN}}(s) = \frac{g_{m,1} r_{O,1} g_{m,2} r_{O,2} \left(1 - s \Big/ \frac{g_{m,2}}{C_1}\right)}{\left(1 + s \Big/ \frac{1}{r_{O,1} C_1}\right)} = A_O \frac{(1 - s/z_1)}{(1 + s/p_1)} \quad (11)$$

Here we see the shunt-C integrator has a pole at $1/(r_{O,1}C_1)$ and a DC gain of $g_{m,1}r_{O,1}$. In contrast, the transfer function of the Miller-C integrator of FIG. 5C is given by Equation (11). Here it can be seen that this integrator contains both a pole and a zero. In the case of the pole, it is located at a much lower frequency than the shunt-C integrator, i.e., $1/(g_{m,2}r_{O,1}r_{O,2}C_1)$, although it also exhibits a high-frequency right-half plane zero at $g_{m,2}/C_1$. The Miller-C integrator also exhibits a much higher DC gain of $(g_{m,2}r_{O,1}r_{O,2}C_1)$.

As long as the high-frequency zero $z_1$ can be placed at least two orders of magnitude greater than the unity gain frequency $\omega_t$, its presence will have little effect. Since the frequency at which the Miller-C integrator reaches unity gain is approximately $g_{m,1}/C_1$ and the parasitic zero is $g_{m,2}/C_1$, then this condition is simply met by ensuring $g_{m,2} > 100\ g_{m,1}$. As a result, the Miller-C integrator will generally result in a larger DC gain and a lower parasitic pole.

For frequencies above the pole frequency $p_1$ and below the zero $z_1$, the transfer function of the Miller-C integrator can be approximated by Equation (12). This reveals that any coefficient of the state-space realization is set by the unity-gain frequency $\omega_t = g_{m,1}/C_1$ of the corresponding Miller-C integrator.

$$\frac{v_O}{v_{IN}}(s) \approx \frac{A_O p_1}{s} = \frac{\omega_t}{s} = \frac{g_{m,1}}{C_1}\left(\frac{1}{s}\right) \tag{12}$$

For simplicity purposes, assume that each Miller-C integrator will be constructed with identical $g_m$ and $r_O$, except that the transconductance associated with the zero term will be set at $100\ g_m$ so that it is at least 100 times away from the unity gain frequency $\omega_t$ of the integrator. Thus, one can write from Equation (11), assuming $\omega_m = g_m/C$, Equations (13A) to (13C) respectively. Armed with the above, the frequency response behavior of an N-th order OTA can be approximated by Equation (14) where R(s) is the remainder function defined by Equation (4) with K=N−1.

$$A_O = g_m^2 r_O^2 \tag{13A}$$

$$p_1 = \frac{1}{g_m r_O^2 C} = \frac{\omega_t}{A_O} \tag{13B}$$

$$z_1 = 100\omega_t \tag{13C}$$

$$A(s) \approx A_O^{N-1} \frac{(1-s/z_1)^N}{(1-s/p_1)^{N-1}} \times R(s) \tag{14}$$

Referring to Table II there are listed the pole and zero locations for a modified Gaussian transfer function for orders 2 to 5. The DC gain of the OTA corresponds to the individual gains of N−1 Miller-C integrator stages, which can be made extremely high, as given by Equation (15).

$$A_{DC} = A_O^{N-1} \tag{15}$$

TABLE II

Pole/Zeros Locations of the Remainder Function R(s) for Different Orders Corresponding to a Modified Gaussian Transfer Function

| | Remainder Function R(s) | |
| --- | --- | --- |
| Order | Zeros | Pole |
| 2 | — | −2.5730 |
| 3 | −0.60615 | −4.2677 |
| 4 | −0.6320 ± j0.50248 | −6.1003 |
| 5 | −0.8295, −0.5681 ± j0.9075 | −8.0817 |

There are N co-incident RHP zeros at $z_1$ and N−1 co-incident low-frequency poles at $p_i$, all resulting from the parasitic elements of the Miller-C integrator. By design, the zeros are purposely placed at least two orders of magnitude higher than the unity-gain frequency of a single stage Miller-C integrator. In regards to the remainder function R(s), there are N−2 LHP zeros located slightly below $\omega_t$ and a single pole at a slightly higher frequency than the unity-gain frequency at $a_{11}\omega_t$. Collectively, the pole-zero combination forces the OTA roll-off to a slope of −20 dB/decade at the unity gain cross-over frequency.

$$\omega_{-3dB} \approx \frac{\omega_t}{A_O}\sqrt{\frac{1}{2^{N-1}} - 1} \tag{16}$$

The 3-dB bandwidth of the OTA can be approximated by Equation (16) where the factor $\sqrt{(\tfrac{1}{2}^{N-1})-1}$ accounts for the bandwidth reduction caused by the co-incident poles. As a point of reference, this factor is equal to I, 0.64, 0.51 and 0.43 for N equal to 2, 3, 4, 5, respectively.

$$GBP \approx A_{DC} \times \omega_{-3\ dB} \approx A_O^{N-2} \omega_t \tag{17}$$

The gain-bandwidth product (GBP) reveals some very interesting properties associated with these ultra-high gain OTAs. Multiplying Equation (15) with Equation (16), one obtains Equation (17). Increasing the number of integrators in cascade can increase the GBP above the unity-gain frequency of the Miller-C integrator. While GBP is an interesting side effect, the real benefit of the proposed ultra-high gain amplifiers over current prior art OTA structures is that a much larger gain is available over its unity-gain bandwidth.

Figure 6A:
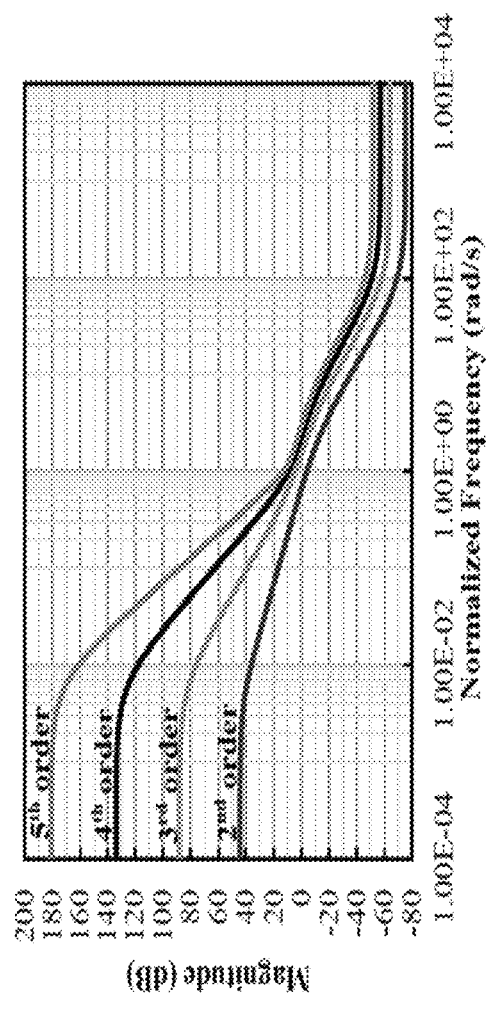
FIGS. 6A-6B are graphs showing an example normalized frequency response of the OTA in open-loop using ideal components.
Figure 6B:
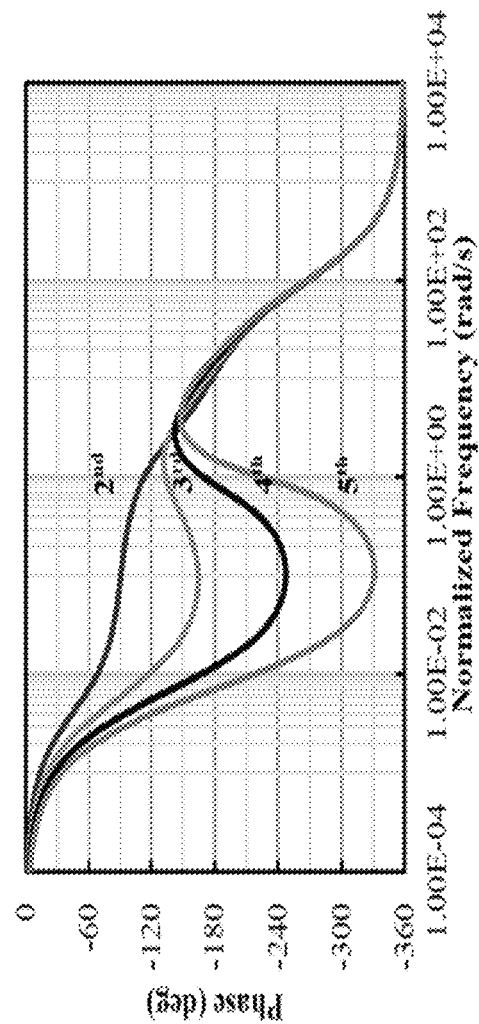

A SPICE-like simulation of the magnitude and phase behavior of the proposed OTA structure is shown in FIGS. 6A and 6B for orders ranging from 2 to 5. Each OTA was designed to have a modified Gaussian unity-gain closed-loop response behavior as described by the polynomial coefficients listed in Table I. As seen from FIG. 6A, the DC gain ranges from 50 dB to as high as 180 dB B for the $5^{th}$ order realization. All four realizations have a similar 3 dB normalized bandwidth of about 0.0001 rad/s. The gain roll-off beyond the 3 dB bandwidth varies from −20 dB/decade to as high as −80 dB/decade, but all reduce to −20 dB/decade at the unity gain frequency. Also shown in FIG. 6B is the corresponding phase behavior. Just before the unity gain frequency, the phase behavior for orders 3 to 5 sees a sudden change in its slope, quickly rising above the critical −180° phase point, staying above this point for at least one decade in frequency then leveling off to −360°. The second order response does not have an LHP zero so there is no change in its phase. However, in all cases, the phase margin remains positive, although decreasing with OTA order.

Figure 7A:
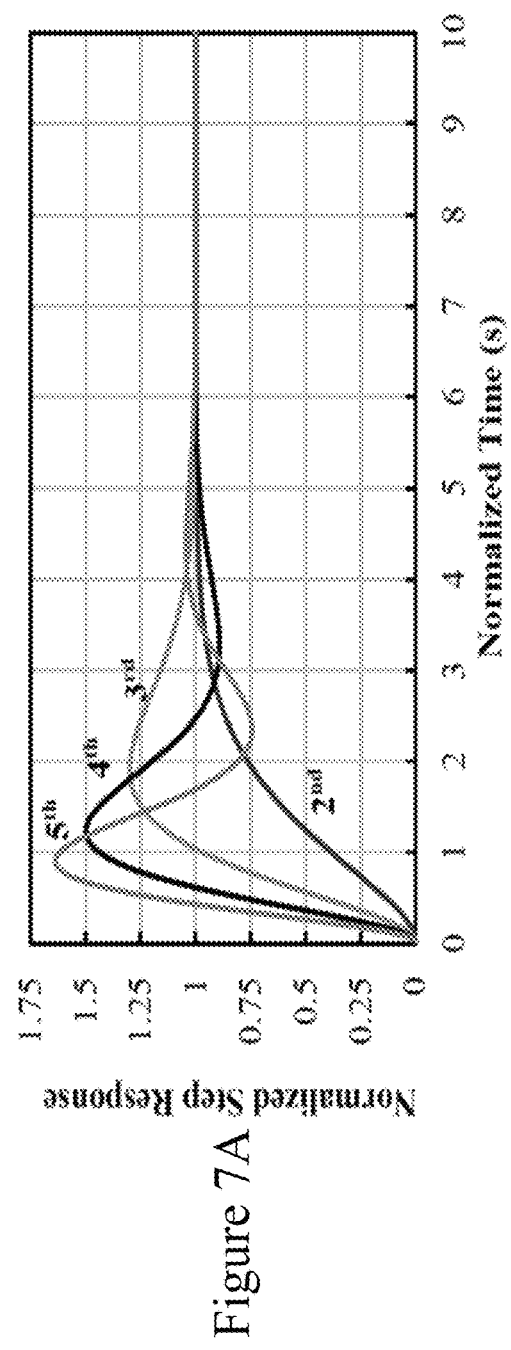
FIG. 7A is a graph showing an example unit response of the OTA in a unity gain configuration using ideal components.
Figure 7B:
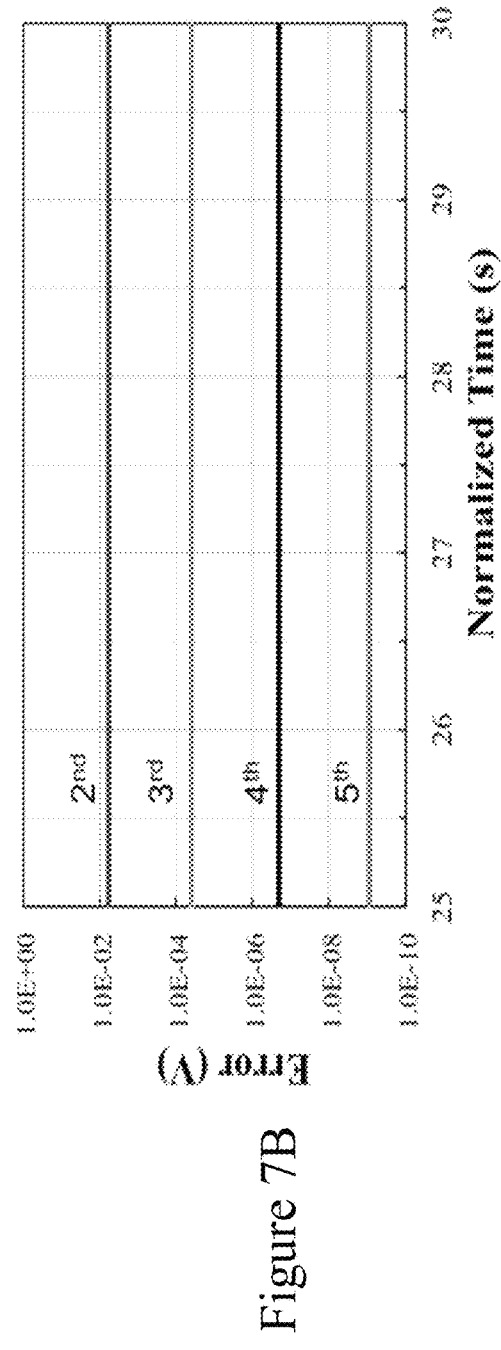
FIG. 7B is a graph showing an expanded view of the final error after settling from the graph of FIG. 7A.

For the purposes of testing, the OTA was connected in a unity-gain configuration and its unit step response was simulated using SPICE and compared to the expected modified-Gaussian behavior. The results are collected for OTA orders from 2 to 5 and displayed in FIG. 7A. As shown, the results all agree with their expected behavior. In addition, the peak value and the amount of ringing increases with order but the propagation delay decreases. Overall, no one order seems to have better settling time. This, therefore, leads to the question of what advantage does a high-order OTA have on the step response of the amplifier. The answer lies with the final error after the amplifier has settled. A higher order OTA will have smaller final settling error, as seen from the captured SPICE results shown in FIG. 7B. The relative error can be seen to be inversely proportional to the DC gain of the OTA.

OTAs often operate over many different bandwidths and impedance levels. By designing with a frequency and impedance normalized prototype, such as those described in Table I, other OTAs can be derived from it by applying a scaling factor to the components of the prototype. In general, there are two independent scale factors that are commonly used. One involves scaling the bandwidth of the OTA and the other involves scaling the impedance level (or in other words, finding more practical component values).

In general, the bandwidth of the OTA can be increased from 1 rad/s to $\omega_O$ rad/s by dividing all integrator capacitors by this same factor given in Equation (18). It should be noted that if the OTA frequency response were to scale to very high frequencies, its behavior would experience changes on account of the influence of various transistor parasitics not considered in our analysis here.

$$C_i \rightarrow \frac{C_i}{\omega_O} \; \forall \; i = 1 \ldots N \quad (18)$$

Figure 8:
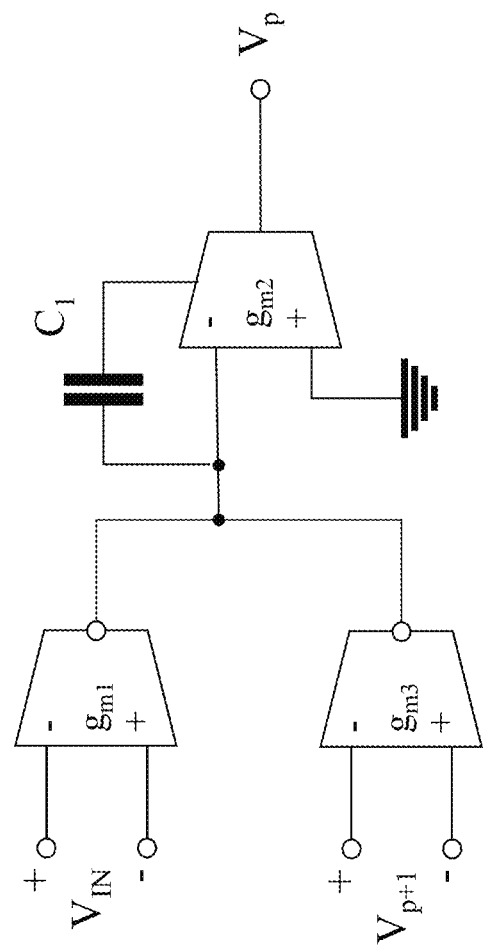
FIG. 8 is an example of a two-input Miller-C integrator.

Conversely, the impedance level of any components associated with a single integrator can be scaled without changing its transfer function as long as the same factor, say $\gamma$, is used on all the transconductances and the integration capacitor associated with that cell. For instance, the two-input Miller-C integrator shown in FIG. 8 consist of three transconductances $g_{m,1}$, $g_{m,2}$, and $g_{m,3}$, and one integrator capacitor $C_i$. These particular components can all be scaled according to the rules given by Equations (19A) to (19D) respectively without altering its transfer function. If resistors were included in the circuit as well, then these would be scaled according to Equation (20A) to (20C) respectively.

$$g_{m,1} \rightarrow \gamma \cdot g_{m,1} \quad (19A)$$

$$g_{m,2} \rightarrow \gamma \cdot g_{m,2} \quad (19B)$$

$$g_{m,3} \rightarrow \gamma \cdot g_{m,3} \quad (19C)$$

$$C_1 \rightarrow \gamma \cdot C_1 \quad (19D)$$

$$r_{O,1} \rightarrow r_{O,1}/\gamma \quad (20A)$$

$$r_{O,2} \rightarrow r_{O,2}/\gamma \quad (20B)$$

$$r_{O,3} \rightarrow r_{O,3}/\gamma \quad (20C)$$

Another form of scaling can be used to equalize the peak or RMS values associated with each integrator output during closed-loop operation. This maximizes the signal handling capability of the overall closed-loop configuration, i.e., maximizes the input linear range before the onset of slew-rate limiting. Moreover, scaling for maximum dynamic range reduces the spread in the various components used to realize the OTA, a benefit that can be exploited with every design.

Through a transient or frequency-domain analysis of the OTA in closed-loop operation, a metric of interest is collected for each integrator output, such as the peak value corresponding to a step input, and assigned to the corresponding element of a diagonal matrix, normalized by the desired peak value $V_{max}$. For instance, if the peak value of the output of the $i^{th}$ integrator is denoted as $\alpha_i$, and then one can write the diagonal matrix as given by Equation (21).

$$T = \frac{1}{V_{max}} \begin{bmatrix} \alpha_1 & 0 & 0 & 0 & 0 \\ 0 & \alpha_2 & 0 & 0 & 0 \\ \ldots & \ldots & \ldots & \ldots & \ldots \\ 0 & 0 & 0 & \alpha_{N-1} & 0 \\ 0 & 0 & 0 & 0 & \alpha_N \end{bmatrix} \quad (21)$$

$$\{A, b, c, d\} \rightarrow \{T^{-1}AT, T^{-1}b, T^Tc, d\} \quad (22)$$

Dynamic range scaling would then be performed on the state-space parameters according to the similarity transformation described by Equation (22). For the specific set of OTA state-space parameters seen listed in Equation (7), one would arrive at the scaled state-space parameters as given by Equations (21A) to (21C) respectively.

$$A = \begin{bmatrix} -d_K & \alpha_2/\alpha_1 & 0 & 0 & 0 \\ 0 & 0 & \alpha_3/\alpha_2 & 0 & 0 \\ \ldots & \ldots & \ldots & \ldots & \ldots \\ 0 & 0 & 0 & 0 & \alpha_N/\alpha_{N-1} \\ 0 & 0 & 0 & 0 & 0 \end{bmatrix} \quad (23A)$$

$$B = \begin{bmatrix} 0 \\ d_{K-1}V_{max}/\alpha_2 \\ \ldots \\ d_1 V_{max}/\alpha_{N-1} \\ d_0 V_{max}/\alpha_N \end{bmatrix} \quad (23B)$$

$$C = [\alpha_1/V_{max} \; 0 \; \ldots \; 0 \; 0] \quad (23C)$$

While the only nonzero element in the C vector appears as though it is no longer unity, in practice, $V_{max}$ and $\alpha_1$ would actually be the same value on account of the goals of the closed-loop system. Table III presents the state-space coefficients corresponding to the modified Gaussian transfer function presented earlier in Table I when scaled for equal integrator transient peak outputs.

TABLE III

Modified Gaussian State Space Coefficients
Scaled for Maximum Dynamic Range
(Equalized Transient Peak Output)

| | A-Matrix State-Space Coefficients | | | | |
|---|---|---|---|---|---|
| Order | $a_{11}$ | $a_{12}$ | $a_{23}$ | $a_{34}$ | $a_{45}$ |
| 2 | −2.573 | 2.545 | | | |
| 3 | −4.268 | 5.612 | 0.394 | | |
| 4 | −6.1000 | 9.230 | 0.857 | 0.422 | |
| 5 | | | | | |

| | B-Matrix State-Space Coefficients | | | | |
|---|---|---|---|---|---|
| Order | $b_1$ | $b_2$ | $b_3$ | $b_4$ | $b_5$ |
| 2 | | 0.753 | | | |
| 3 | | 1.239 | 1.906 | | |
| 4 | | 1.700 | 2.510 | 3.064 | |
| 5 | | 2.181 | 3.148 | 3.804 | 4.294 |

| | C-Matrix State-Space Coefficients | | | | |
|---|---|---|---|---|---|
| Order | $c_1$ | $c_2$ | $c_3$ | $c_4$ | $c_5$ |
| All | 1 | 0 | 0 | 0 | 0 |

A canonical state-space realization is very sensitive to its coefficients. This has to date limited their use as precision filter circuits. However, for OTA applications, this sensitivity is less critical unless the order of the realization is very high, and as such, some form of post-manufacturing calibration can be introduced.

To better understand the performance robustness of the proposed OTA structure, consider the analysis of an OTA design in a unity gain configuration for orders ranging from 2 to 5. As before, a closed-loop modified Gaussian response will be used. Two metrics will be considered. The first is the normalized sensitivity of the peak value of the step response to the individual filter coefficients, $d_i$. Mathematically, it is defined as Equation (24).

$$S_{d_i}^{Peak} = \left| \frac{d_i}{Peak} \frac{\delta Peak}{\delta d_i} \right| \quad (24)$$

Through a numerical analysis, the results of which are displayed in FIG. 9A, we see that the sensitivity to changes in the peak value increases with OTA order. Moreover, we see that the maximum peak sensitivity for the 5th order design occurs with the $b_2$ coefficient. If any coefficient undergoes a 1% change in value, then one can expect a 0.4% change in its peak value, which for many OTA applications is an acceptable amount.

$$S_{d_i}^{T_S} = \left| \frac{d_i}{T_S} \frac{\delta T_S}{\delta d_i} \right| \quad (25)$$

Another sensitivity metric that is quite revealing is the normalized sensitivity to settling time, $T_S$. Mathematically, it is defined by Equation (25) and the results are displayed in FIG. 9B. Here it is shown that the sensitivity to parameter changes is quite low for OTA orders less than 5 but increases very quickly above this value. In fact, a 1% change in the $b_3$ coefficient in a $5^{th}$ order OTA will result in a 25% change in its settling time. In many applications this would be unacceptable unless a large margin was included in the design.

A means to quantify the stability robustness of a closed-loop system was defined using a four polynomial method involving its characteristic function. Consider that the input-output transfer function T(s) of the OTA of FIG. 2 in a unity-gain configuration can be written in terms of its state-space parameters as Equation (26).

$$T(s) = \frac{a_{1,2}b_2s^3 + a_{1,2}a_{2,3}b_3s^2 + a_{1,2}a_{2,3}a_{3,4}b_4s + a_{1,2}a_{2,3}a_{3,4}a_{4,5}b_5}{s^5 - a_{11}s^4 - a_{1,2}b_2s^3 + a_{1,2}a_{2,3}b_3s^2 + a_{1,2}a_{2,3}a_{3,4}b_4s + a_{1,2}a_{2,3}a_{3,4}a_{4,5}b_5} \quad (26)$$

Here, the poles of this system are simply the roots of the denominator polynomial. The system will be stable if the poles of this feedback system remain in the left-half plane (LHP) under all possible variations in the OTA parameters. Assuming each coefficient can undergo a worst-case error offset due to manufacturing, the system will be stable if the roots of the four polynomials given by Equations (27A) to (27D), respectively, remain in the LHP.

$$p_1(s) = s^5 - (1-\varepsilon)a_{11}s^4 + (1+\varepsilon)^2 a_{1,2}b_2s^3 + (1+\varepsilon)^3 a_{1,2}a_{2,3}b_3s^2 + \quad (27A)$$
$$(1-\varepsilon)^4 a_{1,2}a_{2,3}a_{3,4}b_4s + (1-\varepsilon)^5 a_{1,2}a_{2,3}a_{3,4}a_{4,5}b_5$$

$$p_2(s) = s^5 - (1+\varepsilon)a_{11}s^4 + (1-\varepsilon)^2 a_{1,2}b_2s^3 + (1-\varepsilon)^3 a_{1,2}a_{2,3}b_3s^2 + \quad (27B)$$
$$(1+\varepsilon)^4 a_{1,2}a_{2,3}a_{3,4}b_4s + (1+\varepsilon)^5 a_{1,2}a_{2,3}a_{3,4}a_{4,5}b_5$$

$$p_3(s) = s^5 - (1+\varepsilon)a_{11}s^4 + (1+\varepsilon)^2 a_{1,2}b_2s^3 + (1-\varepsilon)^3 a_{1,2}a_{2,3}b_3s^2 + \quad (27C)$$
$$(1-\varepsilon)^4 a_{1,2}a_{2,3}a_{3,4}b_4s + (1+\varepsilon)^5 a_{1,2}a_{2,3}a_{3,4}a_{4,5}b_5$$

$$p_4(s) = s^5 - (1-\varepsilon)a_{11}s^4 + (1-\varepsilon)^2 a_{1,2}b_2s^3 + (1+\varepsilon)^3 a_{1,2}a_{2,3}b_3s^2 + \quad (27D)$$
$$(1+\varepsilon)^4 a_{1,2}a_{2,3}a_{3,4}b_4s + (1-\varepsilon)^5 a_{1,2}a_{2,3}a_{3,4}a_{4,5}b_5$$

Using the state-space parameters for the OTA from Table III for orders of 2 to 5, the worst-case manufacturing error can be found by solving for the value of 2 that leads to the critically damped situation. These results are summarized in Table IV. The higher the OTA order, the lower the tolerance to manufacturing errors. As a first-order approximation, one can state that the maximum error tolerance decreases by a factor of two with increasing order beyond second-order. The careful placement of poles and zeros in the synthesized transfer function results in a more robust closed loop stability than its pole-zero cancellation counterpart, whose closed-loop performance is largely dependent on the magnitude of the process variations.

TABLE IV

Worst-Case Coefficient Tolerances Predicted by Kharitonov's Method

| Order | Max. Error, ε |
| --- | --- |
| 2 | 1.0 |
| 3 | 0.314 |
| 4 | 0.170 |
| 5 | 0.078 |

Figure 10:
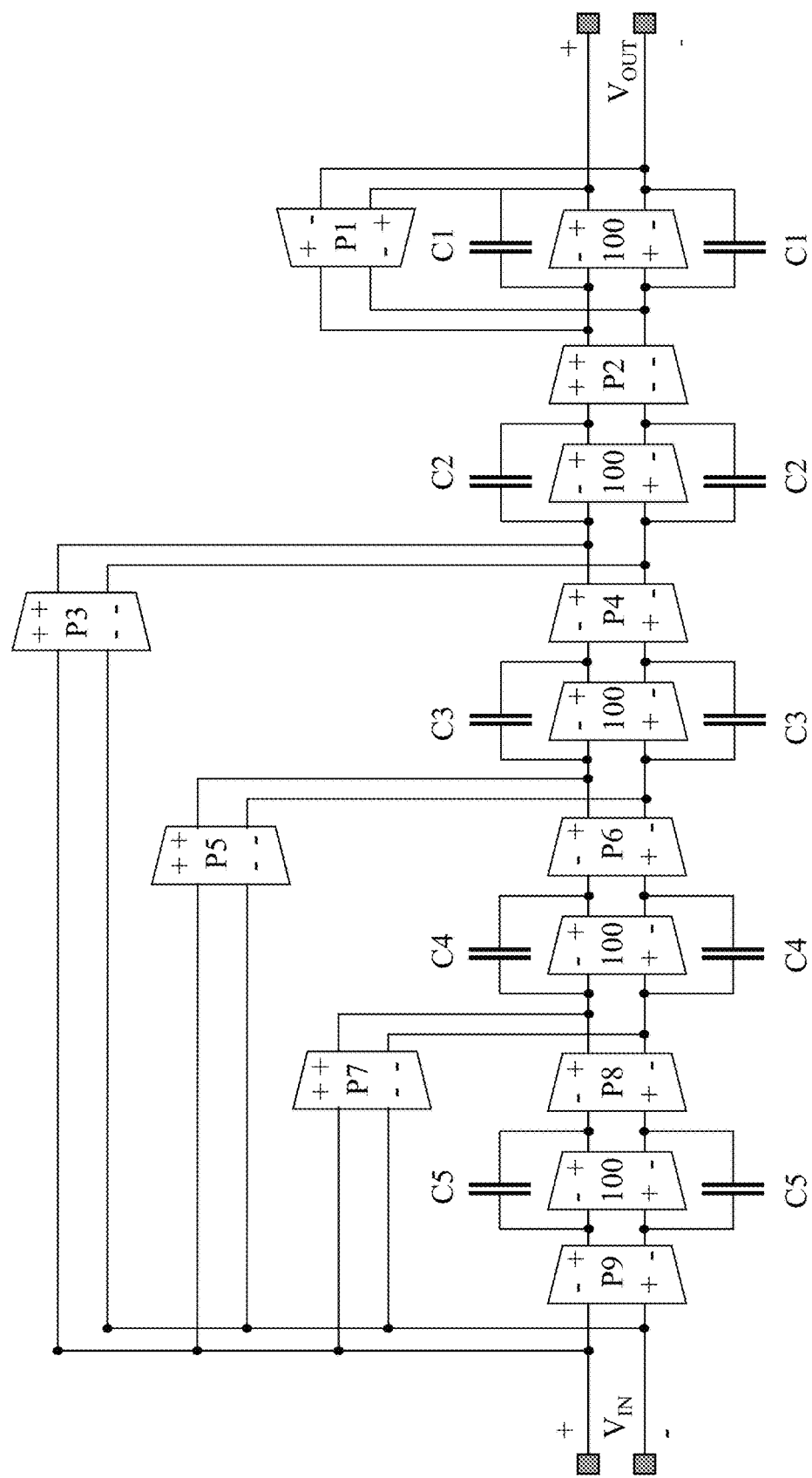
FIG. 10 is an example of a fully programmable ultra-high gain OTA.
Figure 11:
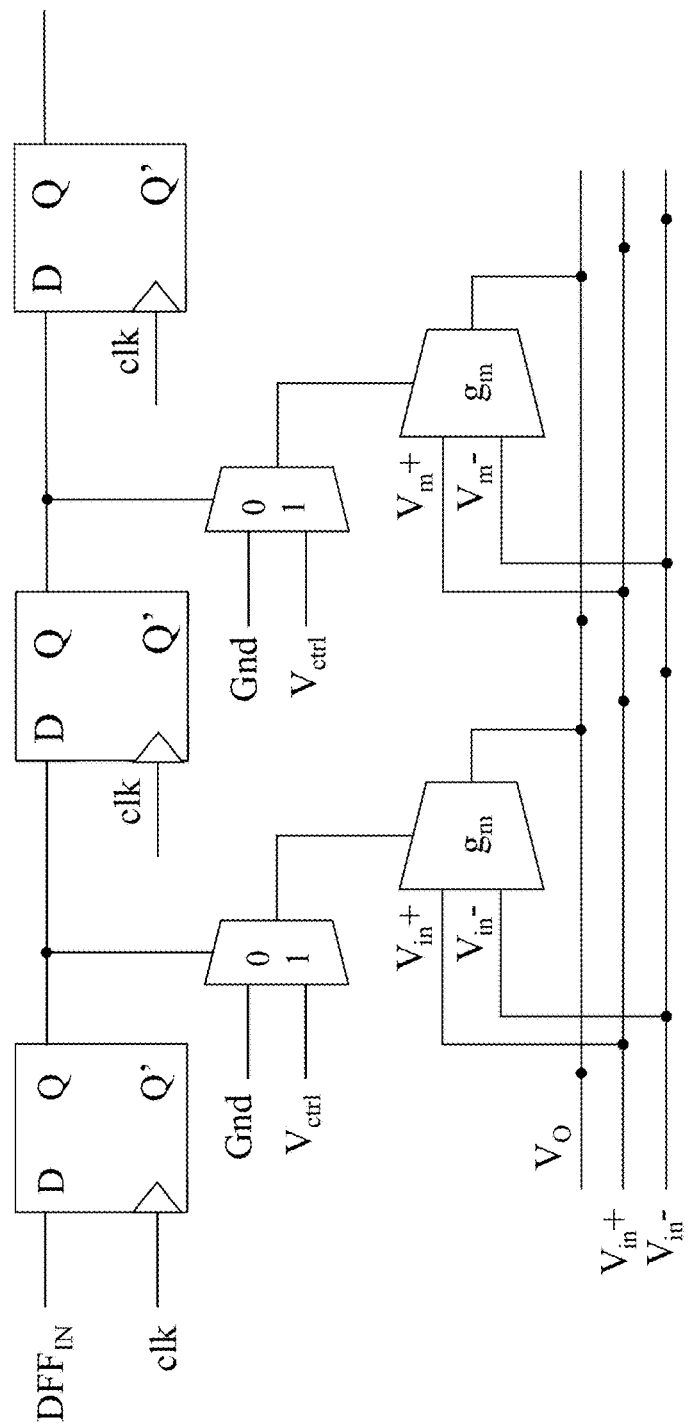
FIG. 11 is an example of a 20-Gm programmable cell.

In order to demonstrate the principles described herein, a fully programmable state-space OTA was designed for fabrication using the IBM 130 nm CMOS process. The design occupies a total active area of 1 mm$^2$, which includes the 23 bond pads with electro-static discharge (ESD) protection. The circuit can be programmed for OTA orders ranging from 2 to 5, and can be used to realize a wide range of transfer functions. A system-level architectural view of the proposed amplifier is depicted in FIG. 10. The basic structure of this amplifier is identical to that shown in FIG. 2 with a one-to-one correspondence between the shaped transconductance cells labeled as P1, P2, P3, . . . , P9 and the state-space parameters, $a_{11}$, $a_{12}$, $b_2$, . . . , $b_5$. These cells are digitally programmable using a bank of twenty unit-sized $G_m$ cells in the manner illustrated in FIG. 11. The transconductance stage is realized with a bank of one hundred unit-sized $G_m$ cells. This will force the zero of each integrator to a frequency of two orders magnitude higher than the unity-gain bandwidth of each integrator. This should minimize the effect of the RHP zeros.

Figure 12:
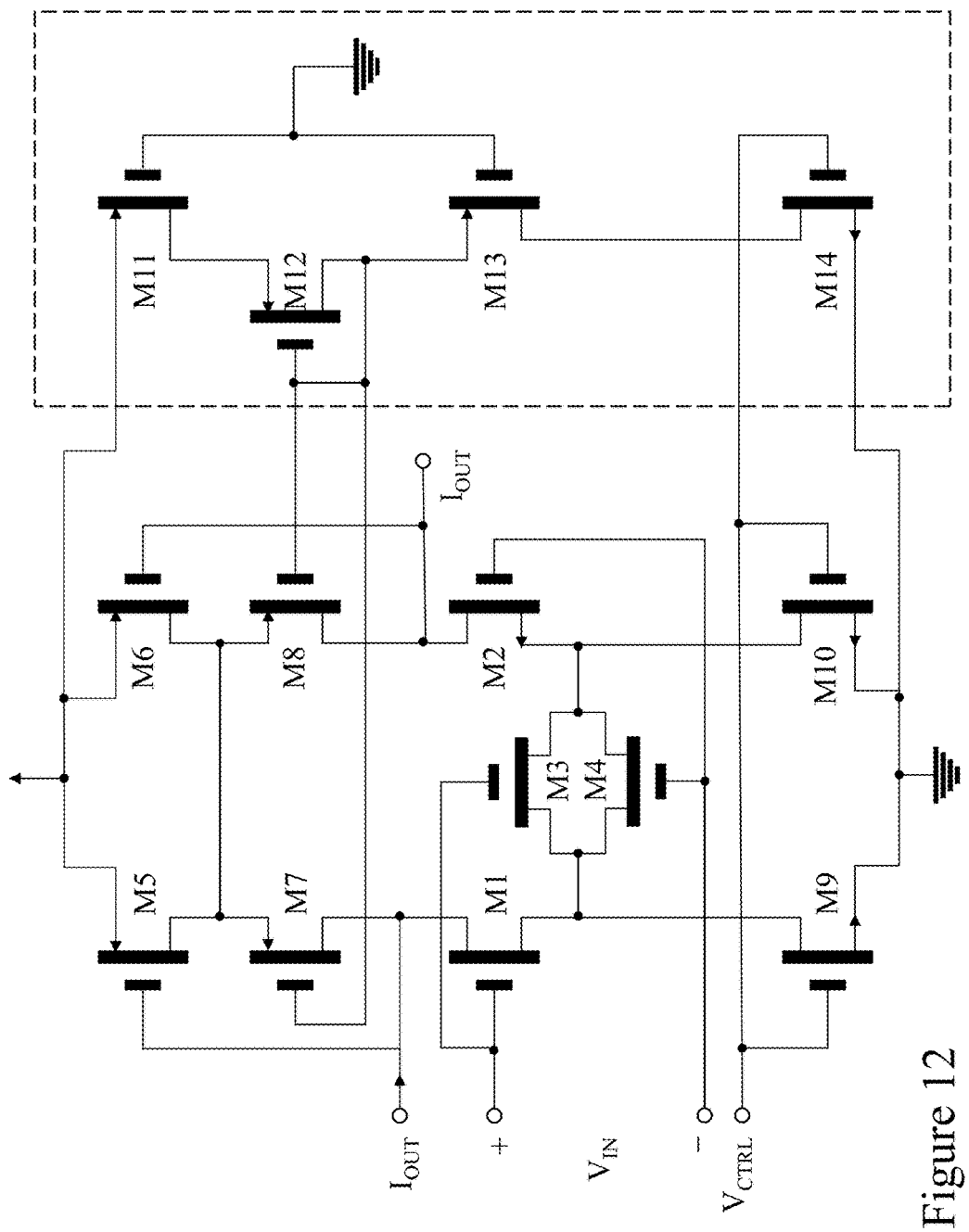
FIG. 12 is an example of a fully differential unit-sized $G_m$ cell.

The unit-sized $G_m$ cell shown in FIG. 12 consists of a transconductance stage and an adaptive bias circuit. Within the transconductance stage, transistors M1 and M2 form the input differential pair; M3 and M4 are the source degeneration transistors to improve the linearity of the transconductance; and M5 and M6 are the common-mode feedback transistors operating in their triode region to set the output common-mode (CM) level. The transconductance of the cell can be changed via the bias voltage $V_{ctrl}$ applied to the gates of transistors M9 and M10. An adaptive bias circuit is included to counteract changes in the output CM level when the transconductance is changed via the control voltage $V_{ctrl}$.

The unit-sized $V_{ctrl}$ cell was designed for a nominal transconductance of 50 μA/V at a control voltage of 300 mV using the transistor aspect ratios listed in Table V. The input and output CM levels are set at one-half the $V_{ON}$ level at 600 mV. At $V_{ctrl}=0V$, the transconductance is observed to vary from 40 μA/V to as high as 66 μA/V for control voltage settings 280 mV≤$V_{ctrl}$≤320 mV as determined by SPICE modelling. Note that the cell can be completely turned off by setting the control voltage to zero. This provides a simple on-off control mechanism that is used to set a desired transconductance level in a programmable $G_m$ cell.

TABLE V

| Unit-Sized $G_m$ Cell Transistor Aspect Ratios | | | | | | |
| --- | --- | --- | --- | --- | --- | --- |
| M1 | M2 | M3 | M4 | M5 | M6 | M7 |
| $\frac{0.72 \mu m}{0.36 \mu m}$ | $\frac{0.72 \mu m}{0.36 \mu m}$ | $\frac{0.72 \mu m}{0.36 \mu m}$ | $\frac{0.72 \mu m}{0.36 \mu m}$ | $\frac{5.04 \mu m}{0.36 \mu m}$ | $\frac{5.04 \mu m}{0.36 \mu m}$ | $\frac{1.44 \mu m}{0.36 \mu m}$ |
| M8 | M9 | M10 | M11 | M12 | M13 | M14 |
| $\frac{1.44 \mu m}{0.36 \mu m}$ | $\frac{1.44 \mu m}{0.36 \mu m}$ | $\frac{1.44 \mu m}{0.36 \mu m}$ | $\frac{1.08 \mu m}{0.36 \mu m}$ | $\frac{2.52 \mu m}{0.36 \mu m}$ | $\frac{2.88 \mu m}{0.36 \mu m}$ | $\frac{1.44 \mu m}{0.36 \mu m}$ |

The programmable $G_m$ stage consists of 20 unit-sized $G_m$ cells all connected in parallel in the manner described earlier and illustrated in FIG. 11. The contribution from each $G_m$ cell to the total transconductance depends on the state of the enable bit established by the corresponding D-type flip-flop. This bit is used to switch between a nominal control voltage level, for example between 280 mV to 320 mV, set externally using the $V_{ctrl}$ pin of the IC or 0V to shut down the cell. A 20-bit binary sequence is used to set the state of the programmable $G_m$. All the enable bits of the nine programmable $G_m$ cells in this prototype are daisy chained together and loaded externally using a 2-wire clock and data control bus.

Fully differential inputs and outputs are used as the target application for this prototype is to realize minimum-sized integrators with a unity-gain bandwidth of approximately 10 MHz. A 2 pF capacitor was used with each integrator realization. Using two feed-in branches to the integrator, one was realized with a unit-sized $G_m$ stage and the other set at 20 times the unit-size. The stage supporting the integrator capacitor was set at 100 unit-sizes. The bias voltage $V_{ctrl}$ for each $G_m$ cell was set at 300 mV.

Figure 13:
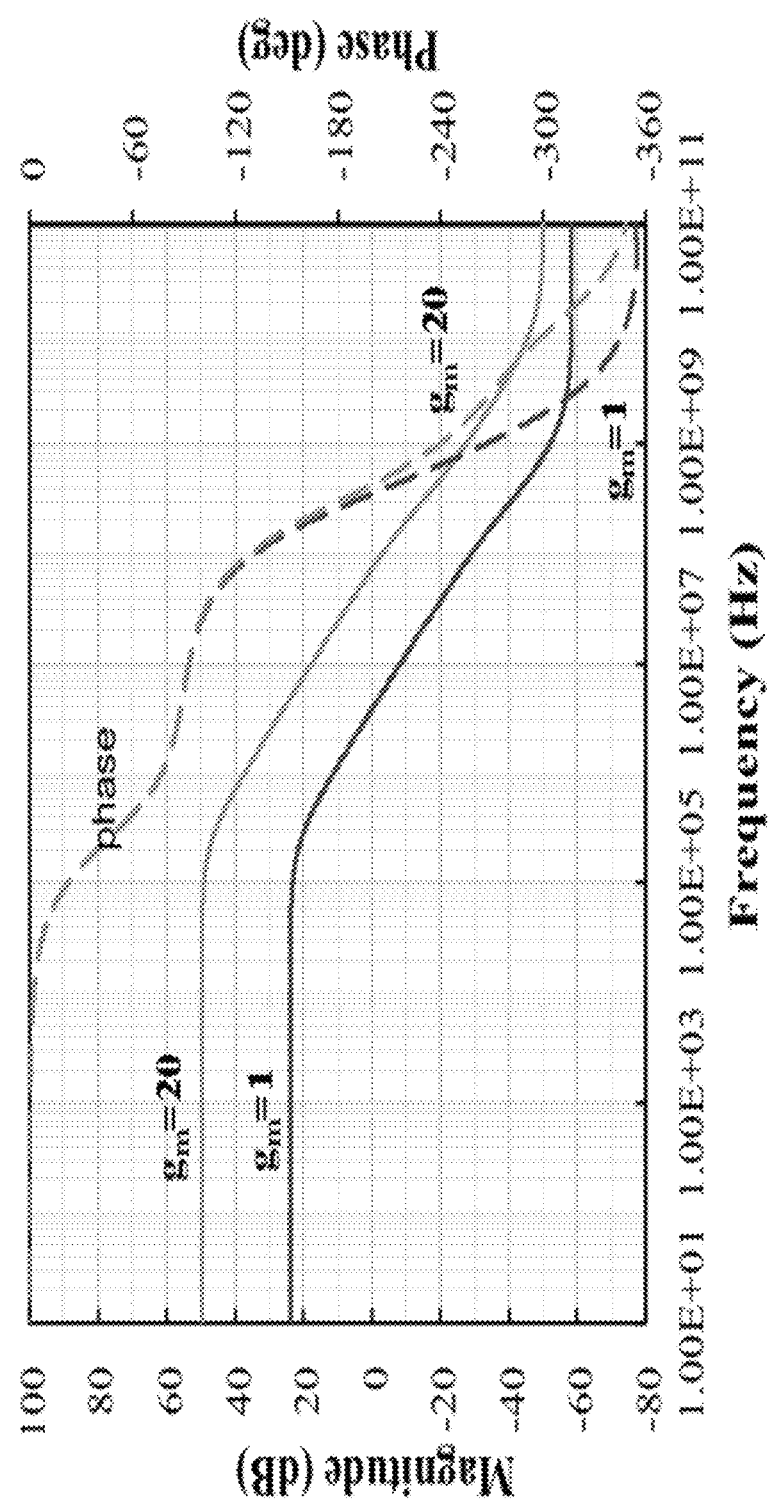
FIG. 13 is a graph of an example frequency response behavior of a two-input Miller-C integrator with one input grounded.

With one input grounded and other excited by a 1V AC voltage source, the frequency response behavior of a fully extracted circuit including layout parasitics was simulated using SPICE. The magnitude and phase results are shown in FIG. 13. As shown, the integrator output corresponding to the unit-sized feed-in branch displays a unity-gain frequency of about 2.5 MHz whereas the integrator output corresponding to the 20 unit-sized feed-in branch has a unity-gain bandwidth of about 70 MHz. It is also shown that the DC gain is 24 dB for the first case and 50 dB for the higher Gm case. An RHP zero is present in both cases; located above 1 GHz in both cases. This zero is caused by gate-drain capacitance associated with each transistor and is not related to the Miller-C RHP zero mentioned earlier. Instead, the Miller-C RHP zero is located close to a new parasitic pole arising from the layout parasitics (e.g., transistor gate capacitances). This is determined from the way the phase changes in the frequency region slightly above the unity-gain frequency.

The a single input integrator described above did not contain this additional parasitic pole. While an expression for this pole in terms of the parasitic elements is rather cumbersome, the general form of the Miller-C integrator transfer function would appear as Equation (28) where $A_O$, $z_1$, and $p_1$ are the same as before as shown in Equation (13) and $p_2$ represents the additional parasitic pole. This parasitic pole-zero pair does degrade the phase behavior of the integrator around its unity gain frequency. For the minimum $G_m$ case, the phase error is about 0° whereas for the maximum $G_m$ case, the phase error is as large as 30°. For the specific transistor sizing used in this Miller-C integrator, each additional unit-sized $G_m$ cell will contribute a 1.5° phase error at their respective unity-gain frequencies.

$$T_1(s) = A_o \frac{(1-s/z_1)}{(1+s/p_1)(1+s/p_2)} \tag{28}$$

For large capacitive loads, an output buffer can be included in the circuit of FIG. 10. As the parasitic poles and zeros of a voltage buffer are generally located at much higher frequencies than the unity gain frequency of the integrators placed in cascade. the output buffer should provide no risk to the dynamic operation of the OTA. However, it will increase the OTA power consumption. In many applications. the load on the OTA is known ahead of time and is not very large in magnitude. As a result, the buffer can be eliminated.

Figure 14:
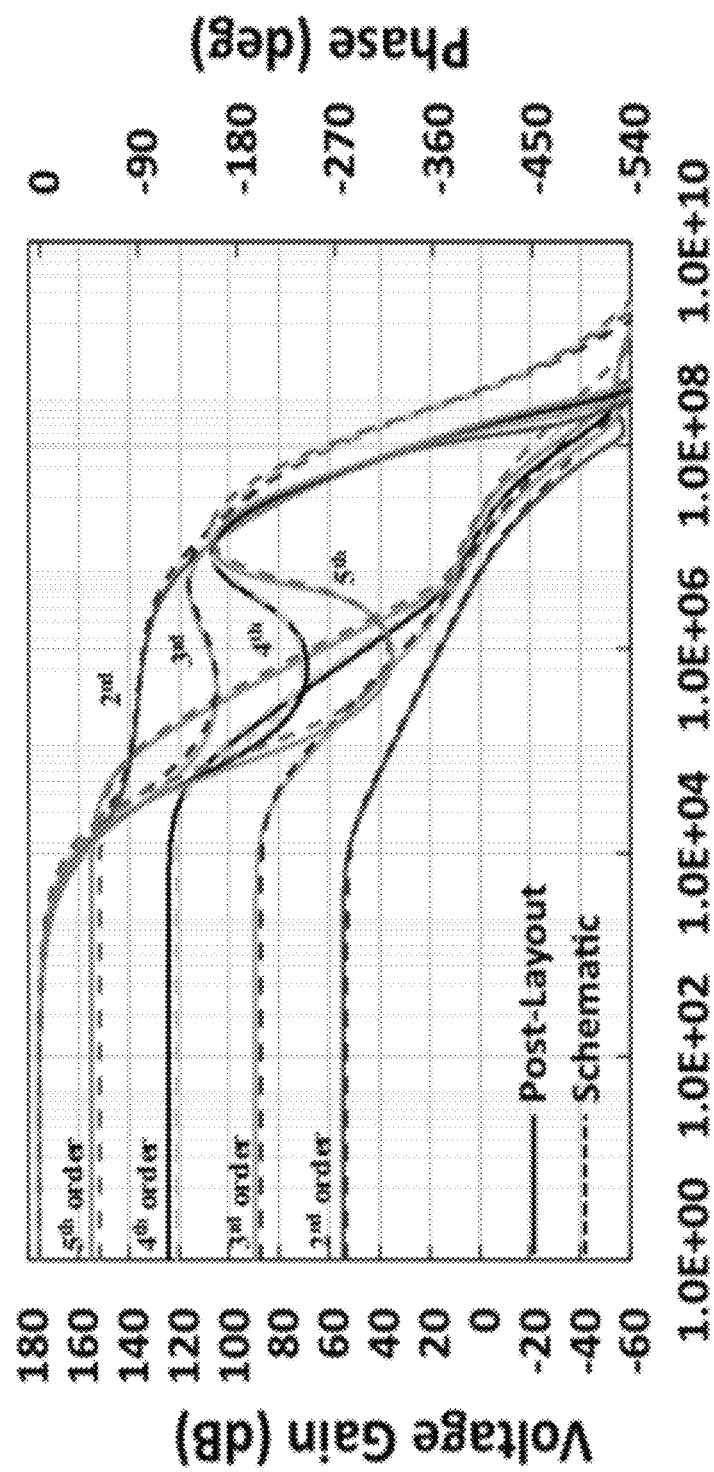
FIG. 14 is a graph of an example frequency response of the open-loop programmable amplifier.

It Note that the phase error contributed by the large $G_m$ cell is not as bad as it appears. As the OTA transfer function is modified by the remainder function R(s), the parasitic pole of each integrator has only a marginal effect on the open-loop response of OTA. To see this, the magnitude and phase response of the OTA with layout parasitics included for orders 2 to 5 is plotted in FIG. 14 and compared to the schematic level response. As is seen, only small differences appear between the two realizations. One can see from FIG. 14 the second-order system has a voltage gain of 58 dB and a phase margin of 70°; the third-order system has a voltage gain of 95 dB and a phase margin of 45° degrees; the forth-order system has a voltage gain of 133 dB and a phase margin of 25°; whereas the filth-order system has a voltage gain of 155 dB and a phase margin of 20°.

In order to measure the impact of the layout parasitics on the OTA as described herein, as well as any coefficient quantization effect, a fully extracted SPICE simulation was performed of a fully differential version of the OTA in a unity-gain configuration. These simulations include all the parasitics in the design, including those that arise from the digital scan chain control lines, pads and ESD structures.

Figure 15:
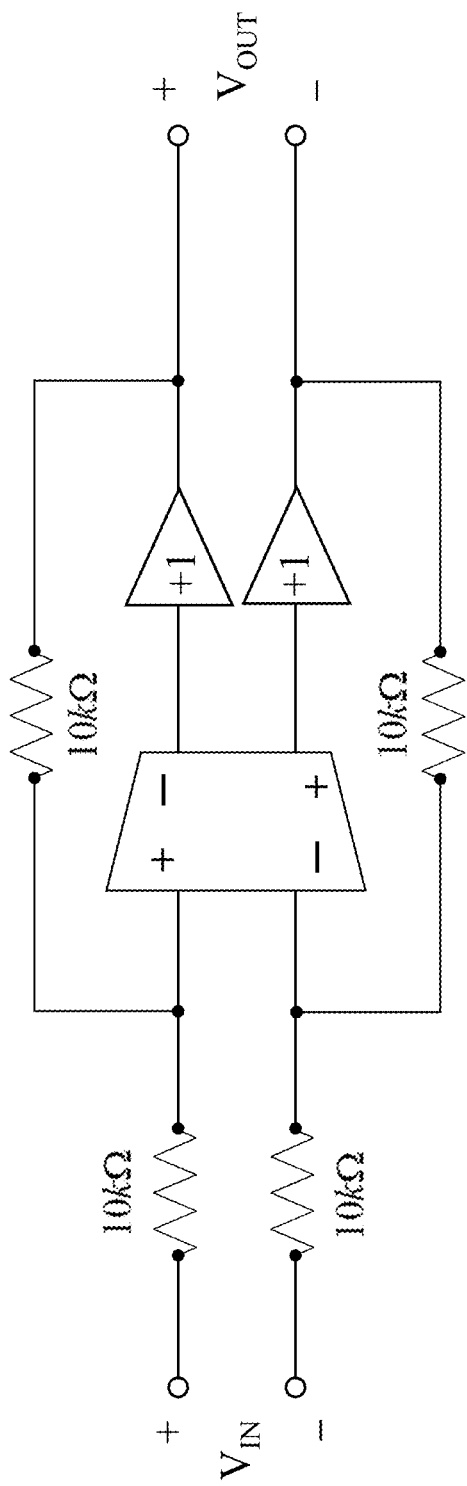
FIG. 15 is an example of a fully differential unity-gain amplifier with resistive feedback.

Owing to the fully differential nature of the OTA, the OTA will be embedded into the unity-gain resistive feedback circuit shown in FIG. 15. As the output impedance of the OTA is rather high, output buffers are included to help drive the resistive feedback loads. The buffers are designed to have a bandwidth 100 times greater than the unity-gain frequency of the OTA.

Note that the feedback factor β is no longer equal to one, as was assumed before, and is now equal to 0.5. This, in turn, requires the OTA to have twice the gain it had before. This is accommodated by doubling all the b coefficients in the state-space formulation shown listed in Table III. Moreover, to implement any one of the state-space realizations described in Table III, one considers that the OTA is programmable in terms of unit-sized $G_m$ cells. Hence, the coefficients in Table III are mapped and quantized in terms of integer values. Table VI lists the values of all integrator capacitors.

TABLE VI

Integrator Capacitor Values

| C1 | C2 | C3 | C4 | C5 |
|---|---|---|---|---|
| 2 pF | 4 pF | 4 pF | 4 pF | 2 pF |

Figure 16:
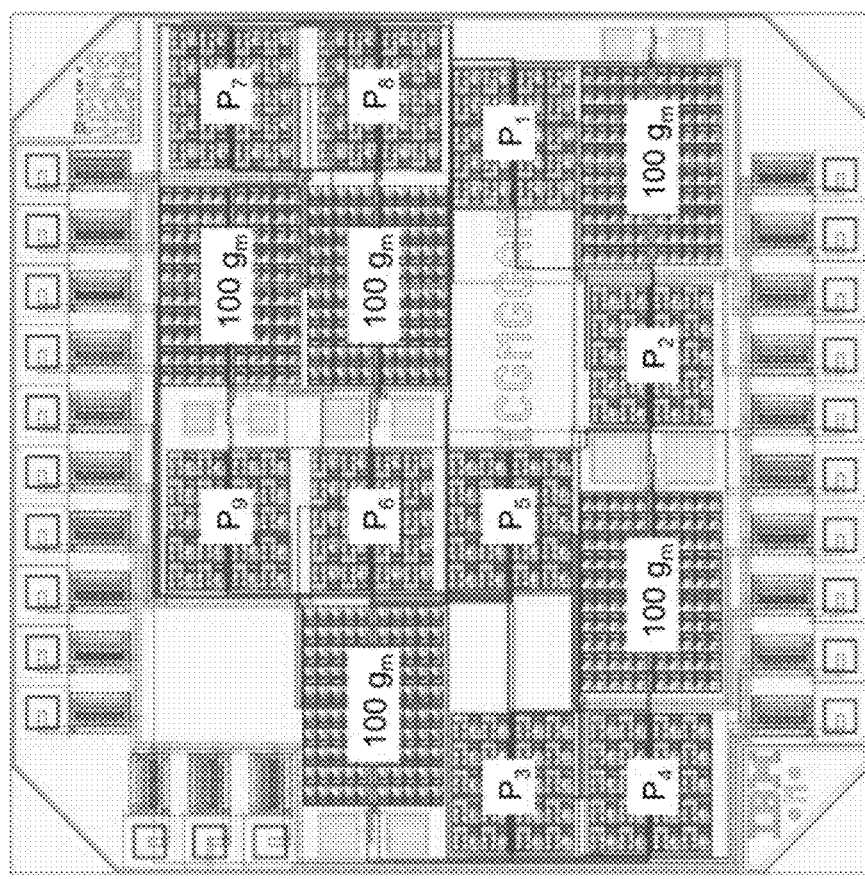
FIG. 16 is an example of a Cadence layout view of the programmable amplifier in the IBM 130 nm technology.

The OTA amplifier layout was implemented using IBM 130 nm CMOS technology. The design occupies a total active area of 1 mm² including the 23 bond pads with ESD protection. The active area occupied by the programmable OTA is approximately 0.6 mm². A schematic layout view of the OTA IC is shown in FIG. 16. Within this the two main banks of 100 and 20 $G_m$ cells are identified. Also depicted are labels for the cells corresponding to the state-space coefficients. All cells were laid out with common-centroid geometries in mind so as to minimize the potential offset problem caused by device mismatches and process variations.

A set of five CMOS chips containing the programmable OTA were manufactured and one of these configured on a PCB for unity-gain operation as depicted in FIG. 15. The two buffers were constructed using BUF602 devices from Texas Instruments whilst a digital pattern generator was used to program the chip with a function generator providing the input step and sinusoidal stimulus. A digital oscilloscope was used to capture the output signals.

Figure 17A:
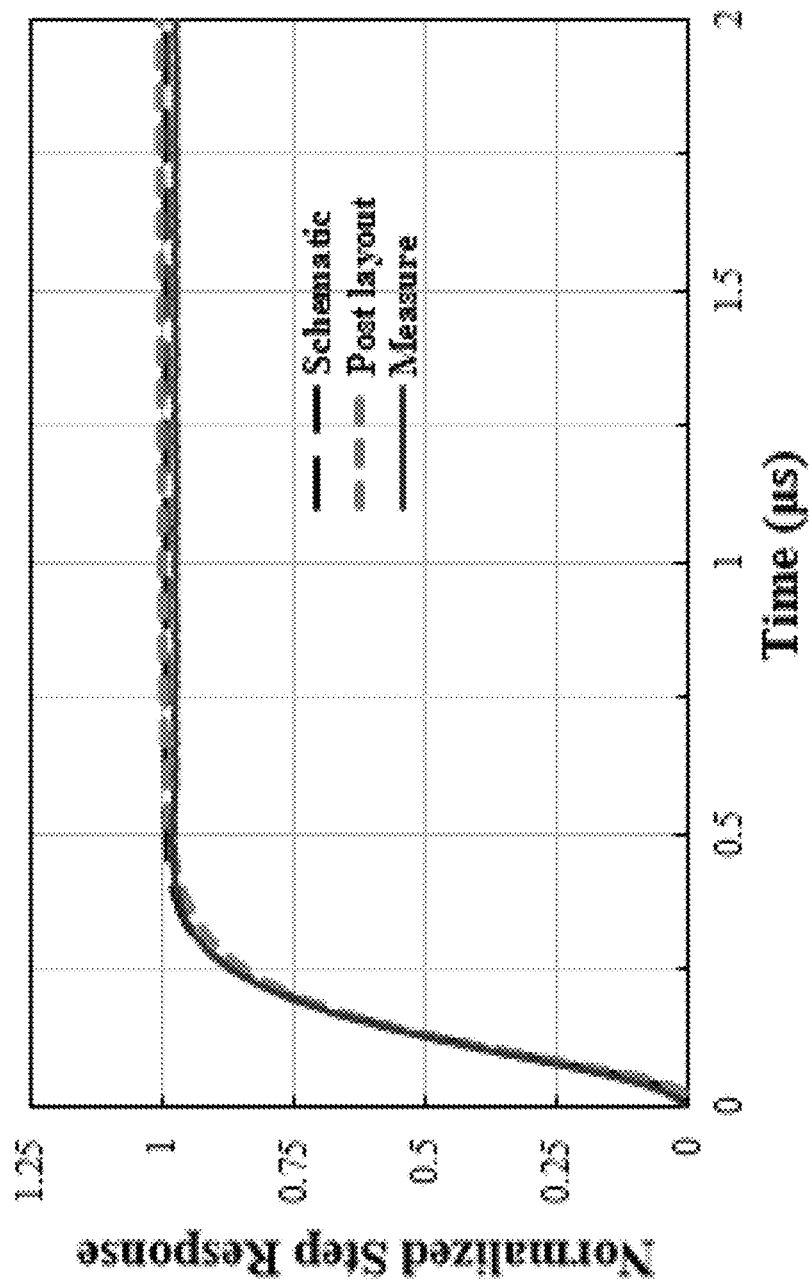
FIGS. 17A-17D are graphs of examples of a measured small-signal step response of the programmable OTA in a unity-gain configuration to a 20 mV step input for various orders.
Figure 17B:
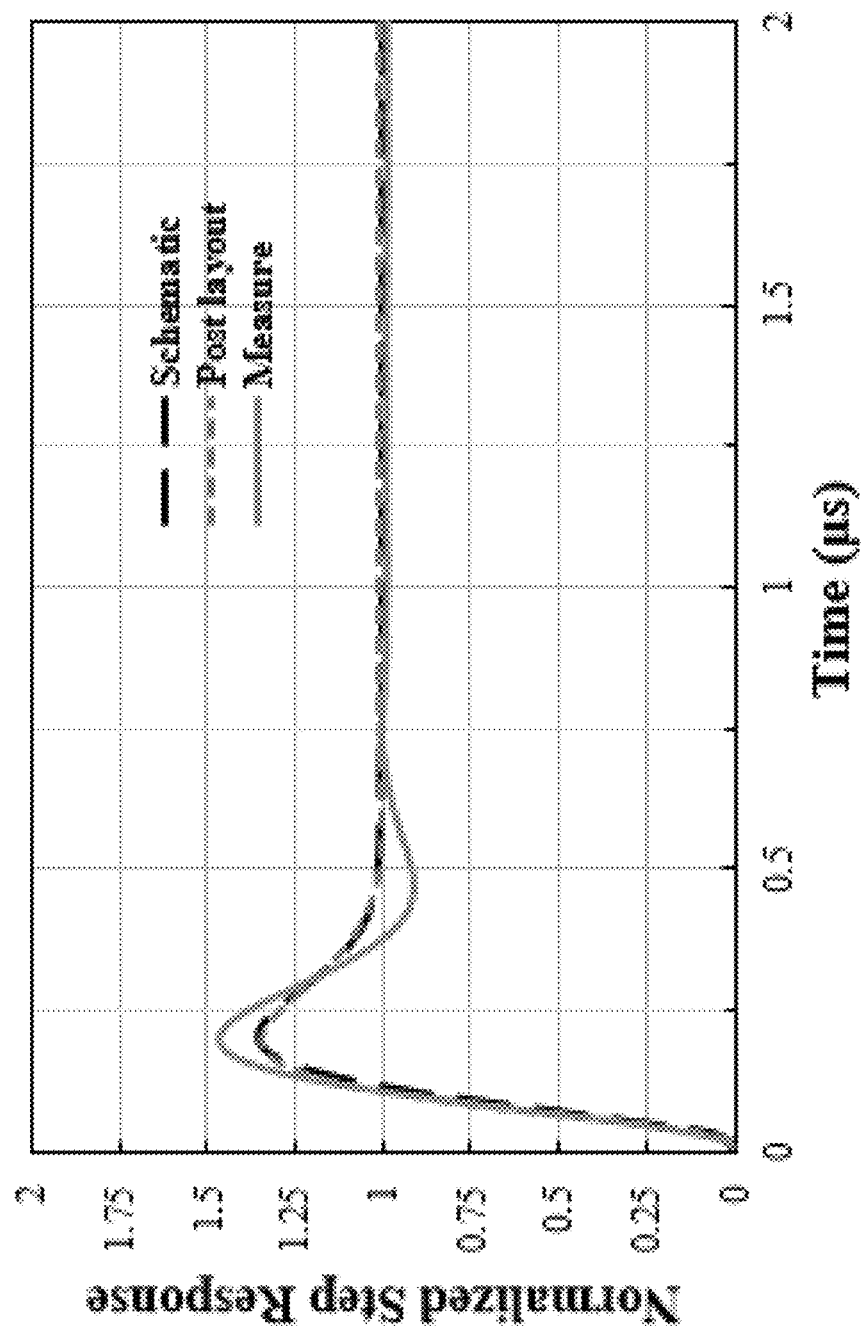

The first test was to verify the operation of the amplifier in a unity-gain configuration in response to a small input step of 20 mV for OTA orders 2 through 5. The measured results in normalized format are plotted in FIGS. 17A-17D. Here the measured step response is compared to the simulated results for the schematic (transistor level without layout parasitics) and the post-layout extracted case. As process variations did cause some time shifts in each measured response, the measured responses were scaled so as to overlay the measured response over the corresponding simulated response. This essentially accounts for systematic shifts in the integrator capacitance and transconductance in each integrator. As is seen from these results, the $2^{nd}$ order (FIG. 17A) and $3^{rd}$ order (FIG. 17B) measured responses are in excellent agreement with the schematic simulated results. Some differences exist between the measured and post-layout simulation results, although the error is quite small. The reason for this error is most likely related to inaccuracies associated with the parasitic layout models. A similar result also applies to the $4^{th}$ order (FIG. 17C) and $5^{th}$ order (FIG. 17D) responses except that the schematic and measured results show some small differences. The post-layout results, again, predict slightly larger errors than those seen from the measured results. The magnitude of this post-layout error is most likely a result of the heightened sensitivity associated with the $4^{th}$ and $5^{th}$ order realizations.

Figure 18:
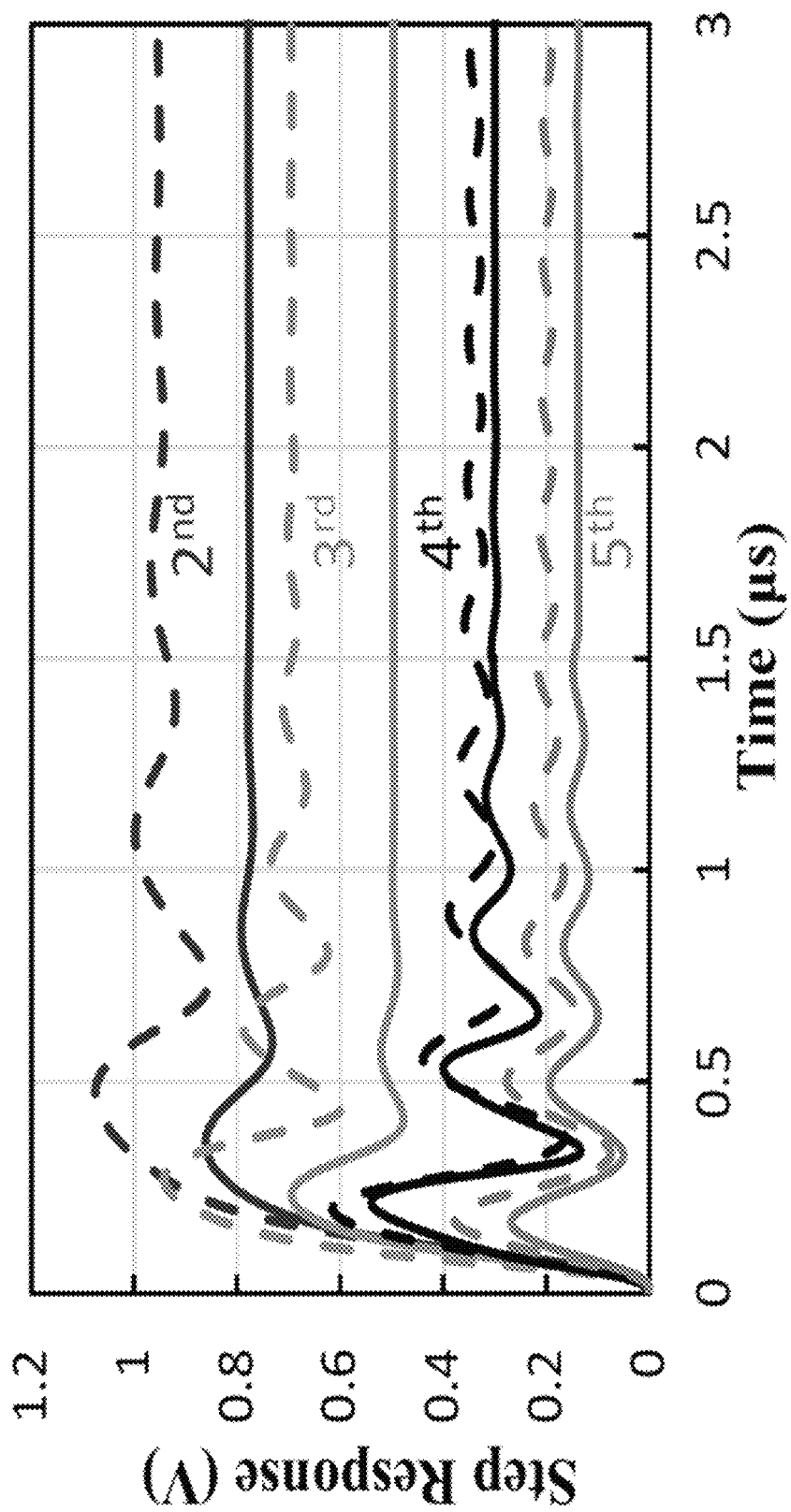
FIG. 18 is a graph of an example measured large-signal step response of all four OTA orders before and after excessive ringing.
Figure 19:
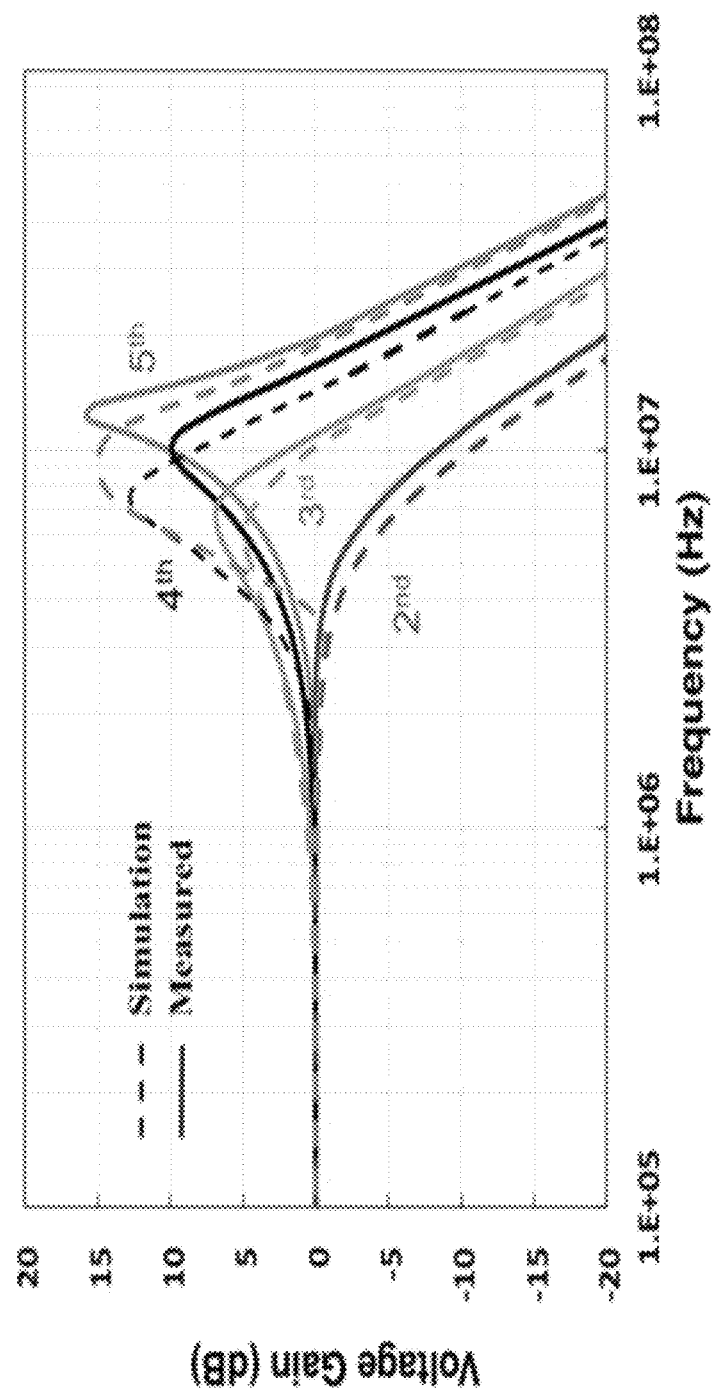
FIG. 19 is a graph of a comparison between the measured and simulated AC response of the amplifier in a unity-gain closed-loop configuration.

The second test performed involved increasing the magnitude of the step input from 20 mV to a higher level until the amplifier output showed signs of excessive ringing or slew-rate limiting. The results captured from the benches are shown in FIG. 18 for OTA orders ranging from 2 to 5. For each OTA order, two step response plots are shown. These two plots correspond to the point just before and right after excessive ringing occurred. In the case of the 2nd order OTA, the largest step input was found to be just below 850 mVpp. In the case of the 3rd order OTA, this point was 600 mV. For the $4^{th}$ order case, this point was 350 mV and the 5th-order case was 160 mV. The higher the OTA order, the lower the maximum input level. It is interesting to note that at no time was any slew-rate limiting effects observed at the output, i.e., a slowdown of the edge rates at the transition time. However, these results do indicate that the individual $G_m$ cells are being pushed beyond their linear range, causing the poles-zeros of the OTA to shift towards increased output ringing. At no time do we see the $G_m$ cell shutting down. The measured AC response of the amplifier in a unity-gain configuration for a 20 mV sinusoidal input signal (solid line) as compared to the post-layout simulated response (dotted line) is shown in FIG. 19 for all four orders Here we see the resonance peaks increase with OTA order. The $2^{nd}$ order OTA has a 3 dB bandwidth of about 2 MHz, the 3rd order about 6 MHz, the $4^{th}$ order about 9 MHz and the 5th order a 3 dB bandwidth of 10 MHz. For the most part, the difference between the post-layout simulated AC response and the measured result is largely the result of coefficient quantization error, as the general shape of each curve is quite similar.

A summary of the measured performance of the OTA (without buffer) is listed in Table VII. Various performance metrics like gain, bandwidth, slew-rate, phase margin, power and active area are listed as a function of the OTA order. Only the slew rate of the $2^{nd}$ order OTA was observed before the OTA operation exhibits excessive ringing. In addition, these results are compared to five separate prior art OTA realizations.

TABLE VII

Summary of OTA Measured Performance (Without Buffer)

| Metrics | Units | Amplifier Circuit Described Herein | Prior Art A | B | C | D | E |
|---|---|---|---|---|---|---|---|
| Technology | nm | 130 | 130 | 500 | 500 | 65 | 65 |
| Power Supply | V | 1.2 | 1.2 | 2.5 | 1.5 | 1.2 | 1.0 |

TABLE VII-continued

Summary of OTA Measured Performance (Without Buffer)

| Metrics | Units | Amplifier Circuit Described Herein | | | | Prior Art | | | | |
|---|---|---|---|---|---|---|---|---|---|---|
| | | | | | | A | B | C | D | E |
| Order | | 2 | 3 | 4 | 5 | 1 | 1 | 1 | 1 | 1 |
| # Undamped Integrators | | 1 | 2 | 3 | 4 | 1 | 1 | 1 | 1 | 1 |
| # Cascaded Gain Stages | | 4 | 6 | 8 | 10 | 2 | 2 | 3 | 3 | 4 |
| DC Gain | dB | 52 | 83 | 120 | 150 | 71 | 90 | 110 | 100 | 100 |
| 3 dB Bandwidth | kHz | 12 | 17 | 2 | 28 | 10 | 8 | 0.14 | 0.2 | 0.4 |
| Gain-Bandwidth Product | MHz | 4.8 | 24 | 25000 | 885437 | 35 | 250 | 4.4 | 2 | 40 |
| Unity Gain Frequency | MHz | 4.8 | 10 | 15 | 20 | 35 | 250 | 4.4 | 2 | 40 |
| Avg. Slew Rate (Unity Gain) | V/μs | 5 | ≥5 (not observed excessive ringing) | | | 19.5 | — | 1.8 | 0.65 | 33.76 |
| Avg. 1% Setting Time | ms | 0.37 | 0.82 | 0.92 | 1.27 | 0.134 | 0.015 | 1.9 | 1.23 | 0.04 |
| Load Capacitance | pF | | 1 | | | 5.5 | 12 | 150 | 500 | 15 |
| Phase Margin | degrees | 57 | 42 | 30 | 18 | 45 | — | 57 | 52 | 64 |
| Power | mW | 3.72 | 5.76 | 7.96 | 10.2 | 0.11 | 14 | 0.03 | 0.02 | 0.72 |
| Active Die Area | mm² | | 0.6 | | | 0.012 | 0.16 | 0.02 | .009 | 0.014 |
| $FOM_S$ | | 1.29 | 41.7 | 3140 | 86808 | 1750 | 214 | 22000 | 49020 | 833 |
| $SIFOM_S$ | | 4.18 | 61 | 4096 | 82083 | 15672 | 35667 | 17368 | 47824 | 20825 |
| Flexibility | | Fully Programmable | | | | Non-Programmable | | | | |

To further demonstrate the features of OTAs according to some embodiments, two small-signal figure of merits (FOMs) were defined as given by Equations (29A) and (29B) respectively and are used to compare the results of OTAs according to embodiments described herein with prior art results. For OTA orders larger than 3, the OTAs according to embodiments described herein have comparable or better figures of merit. This stems from the very high DC gain that gives the OTAs according to embodiments described herein very high gain bandwidth products (GBPs).

$$FOM_S = \frac{GBP \cdot C_{LOAD}}{Power} \quad (29A)$$

$$SIFOM_S = \frac{GBP \cdot C_{LOAD}}{T_S \cdot I_{DD}} \quad (29B)$$

All four orders of the OTA proposed here have high 3-dB bandwidth with a minimum of 10 kHz. While this suggests the proposed designs would have very high gain-bandwidth products, the unity gain frequencies are only moderate between 5 MHz and 20 MHz. This is the result of the multi-pole behavior introduced by the proposed topology in contrast to the single-pole behavior found with all other OTA topologies. The proposed OTA consumes a large active area and static power as the 100 $G_m$ cell assigned in the Miller-C integrator has to account for the effect of various programming numbers as the order of OTA increases. In comparison to other designs, this is a result of its fully programmable nature, an aspect that the prior art designs do not have.

Figure 17C:
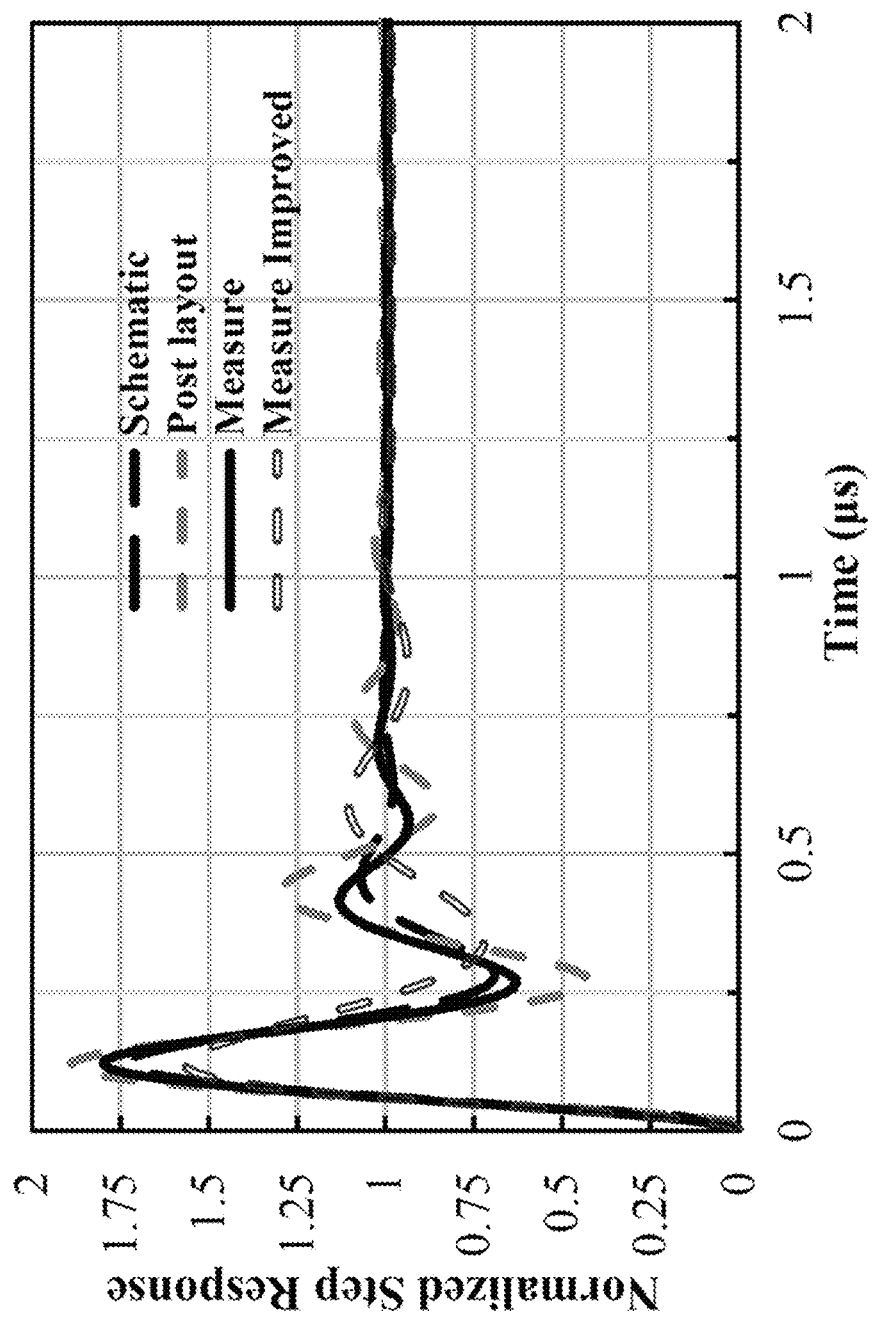
Figure 17D:
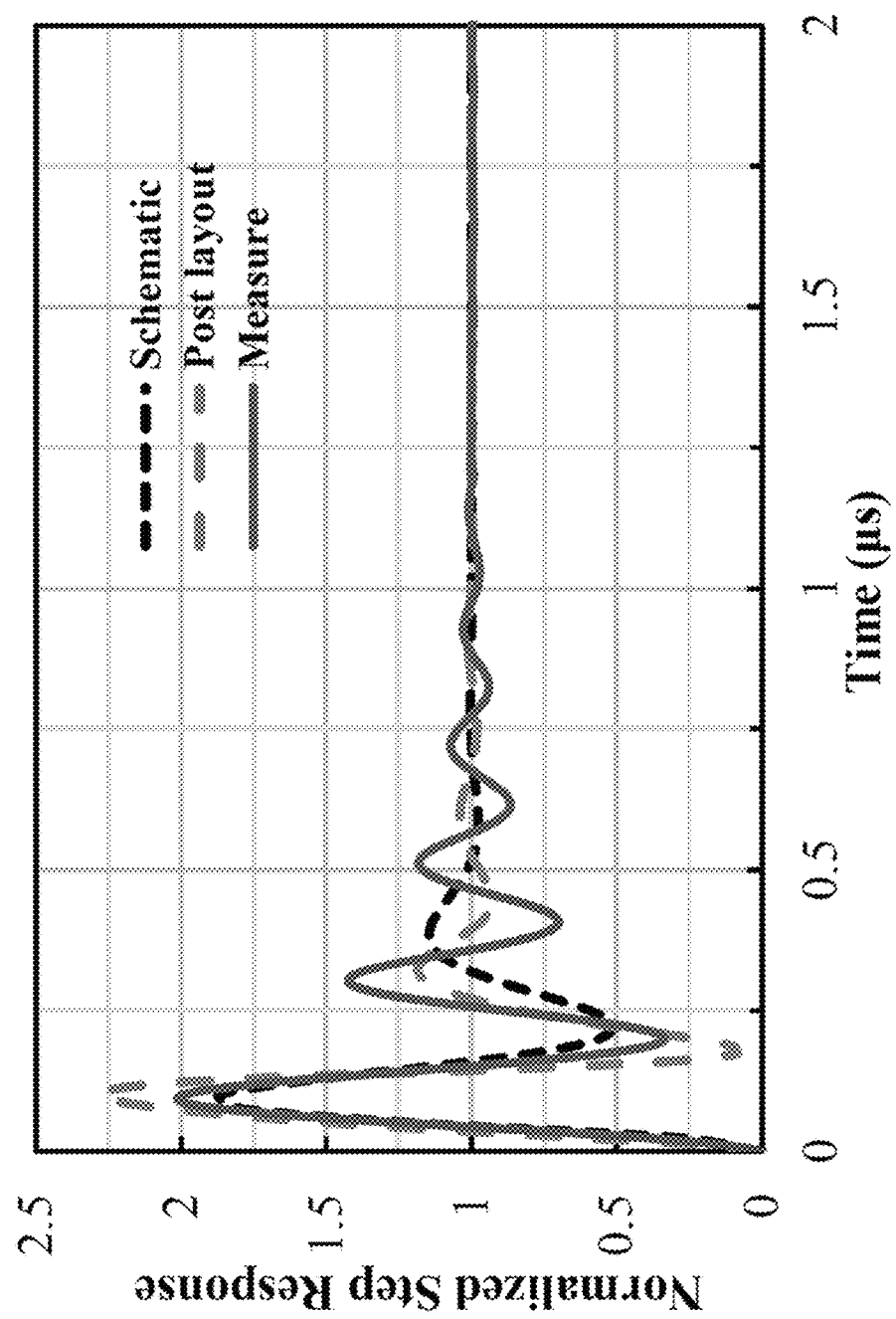

To reduce the overshoot and undershoot associated with high-order OTA designs, a search for a new pole-zero canonical transfer function was undertaken. Through computer optimization methods, a new pole-zero canonical transfer function with reduced over/undershoot was obtained for the $4^{th}$ order realization as shown in FIG. 17C. This transfer function was found by minimizing the mean-square error between the desired step response and actual transfer function by iterating on individual filter coefficients, and it indicates a set of different numbers for programmable cells P1, P4, and P7 of the 4th-order OTA as depicted in FIG. 10. This change shifts the LHP zeros to a lower frequency so that better closed-loop stability can be achieved with minimum effect on other circuit parameters. The computer optimized transfer function has about 25% less overshoot and about 10% less undershoot than the original case. A similar result can be applied to any other OTA order. In the limit, letting the optimizer continue forces the set of 3 zeros to overlap with 3 poles, leaving a single-pole response.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

The foregoing disclosure of the exemplary embodiments has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

The invention claimed is:

1. An amplifier circuit comprising:
a plurality of cascaded circuit elements arranged in a closed-loop topology, the closed-loop topology comprising a plurality of gain stages defined by the cascaded circuit elements; and
a controller provided in the closed-loop topology, the plurality of cascaded circuit elements and the controller together implementing an open-loop transfer function composed of an amplifier function and a remainder function, the gain stages corresponding to the amplifier function and the controller configured to implement the remainder function.

2. The amplifier circuit of claim 1, wherein the closed-loop topology defines one of an operational transconductance amplifier and an operational amplifier.

3. The amplifier circuit of claim 2, wherein the plurality of gain stages each comprise at least one undamped integrator.

4. The amplifier circuit of claim 3, wherein the at least one integrator is a Miller-C integrator.

5. The amplifier circuit of claim 3, wherein the at least one integrator is a two-input Miller-C integrator.

6. The amplifier circuit of claim 1, wherein the remainder function is a pole-zero canonical type transfer function.

7. The amplifier circuit of claim 1, wherein the controller is composed of a plurality of controller elements, wherein the controller elements are interleaved with the cascaded circuit elements in the closed-loop topology.

8. The amplifier circuit of claim 1, wherein the amplifier circuit is programmable to operate on multiple orders and realize a plurality of closed-loop transfer functions.

9. The amplifier circuit of claim 1, wherein the amplifier circuit is realized using a canonical state-space formulation.

10. The amplifier circuit of claim 1, wherein at least one of bandwidth, impedance, and dynamic range is scaled using a scaling factor.

11. A method for providing an amplifier circuit, the method comprising:
selecting a closed-loop transfer function for the amplifier circuit, the closed-loop transfer function having a corresponding open-loop transfer function composed of an amplifier function and a remainder function;
determining a closed-loop topology for a plurality of cascaded circuit elements and a controller, the cascaded circuit elements defining a plurality of gain stages that correspond to the amplifier function of the open-loop transfer function; and
configuring the controller to implement the remainder function of the open-loop transfer function.

12. The method of claim 11, wherein the closed-loop topology defines one of an operational transconductance amplifier and an amplifier.

13. The method of claim 12, wherein the plurality of gain stages each comprise at least one undamped integrator.

14. The method of claim 13, wherein the at least one integrator is a Miller-C integrator.

15. The method of claim 13, wherein the at least one integrator is a two-input Miller-C integrator.

16. The method of claim 11, wherein the remainder function is a pole-zero canonical type transfer function.

17. The method of claim 11, wherein the controller is composed of a plurality of controller elements, wherein the controller elements are interleaved with the cascaded circuit elements in the closed-loop topology.

18. The method of claim 11, further comprising programming the amplifier circuit to operate on multiple orders and to realize a plurality of closed-loop transfer functions.

19. The method of claim 11, further comprising using a canonical state-space formulation to realize the amplifier circuit.

20. The method of claim 11, further comprising scaling at least one of bandwidth, impedance, and dynamic range using a scaling factor.

* * * * *